United States Patent
Seo et al.

(10) Patent No.: US 9,099,573 B2
(45) Date of Patent: Aug. 4, 2015

(54) NANO-STRUCTURE SEMICONDUCTOR LIGHT EMITTING DEVICE

(71) Applicants: Yeon Woo Seo, Hwaseong-Si (KR); Jung-Sub Kim, Hwaseong-Si (KR); Young Jin Choi, Seoul (KR); Denis Sannikov, Suwon-Si (KR); Han Kyu Seong, Seoul (KR); Dae Myung Chun, Hwaseong-Si (KR); Jae Hyeok Heo, Suwon-Si (KR)

(72) Inventors: Yeon Woo Seo, Hwaseong-Si (KR); Jung-Sub Kim, Hwaseong-Si (KR); Young Jin Choi, Seoul (KR); Denis Sannikov, Suwon-Si (KR); Han Kyu Seong, Seoul (KR); Dae Myung Chun, Hwaseong-Si (KR); Jae Hyeok Heo, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/485,663

(22) Filed: Sep. 12, 2014

(65) Prior Publication Data

US 2015/0118777 A1  Apr. 30, 2015

(30) Foreign Application Priority Data

Oct. 31, 2013 (KR) ......................... 10-2013-0131310
Dec. 26, 2013 (KR) ......................... 10-2013-0164521

(51) Int. Cl.
*H01L 21/00* (2006.01)
*H01L 33/00* (2010.01)
*H01L 33/14* (2010.01)
(Continued)

(52) U.S. Cl.
CPC ............ *H01L 33/0075* (2013.01); *H01L 33/08* (2013.01); *H01L 33/145* (2013.01); *H01L 33/20* (2013.01); *H01L 33/24* (2013.01);
(Continued)

(58) Field of Classification Search
CPC ... H01L 33/0075; H01L 33/145; H01L 33/24; H01L 33/38; H01L 33/08; H01L 33/20; H01L 33/32; H01L 33/007; H01L 2933/0016
USPC .......................... 438/34, 46, 47, 44, 481, 22
See application file for complete search history.

(56) References Cited

U.S. PATENT DOCUMENTS 5,910,119 A    6/1999  Lin
6,372,608 B1   4/2002  Shimoda et al.
(Continued)

FOREIGN PATENT DOCUMENTS

JP    05-123319 A    5/1993
JP    2005-087293 A  4/2005
(Continued)

OTHER PUBLICATIONS

International Search Report issued in International Application No. PCT/KR2014/010310 with Date of mailing Jan. 19, 2015.

*Primary Examiner* — Michael Trinh
(74) *Attorney, Agent, or Firm* — Sughrue Mion, PLLC

(57) ABSTRACT

A method of manufacturing a light emitting device having a plurality of nano-light emitting structures is provided. The method comprises depositing a first conductivity-type semiconductor material on a substrate to form a base layer. A mask having a plurality of openings is formed on the base layer. The first conductivity-type nitride semiconductor material is deposited in the openings of the mask to form a plurality of nanocores having a main portion bounded by the mask and an exposed tip portion. A current blocking layer is deposited on the tip portion of the nanocores. A portion of the mask is removed to expose the main portion of the nanocore. An active material layer is deposited on the plurality of nanocores. A second conductivity-type nitride semiconductor layer is deposited on the active material layer.

20 Claims, 30 Drawing Sheets

(51) Int. Cl.
   *H01L 33/24* (2010.01)
   *H01L 33/38* (2010.01)
   *H01L 33/08* (2010.01)
   *H01L 33/20* (2010.01)
   *H01L 33/32* (2010.01)

(52) U.S. Cl.
   CPC ............ *H01L 33/32* (2013.01); *H01L 33/38* (2013.01); *H01L 2933/0016* (2013.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,459,728 B2 * | 12/2008 | Oohata ............ 257/98 |
| 7,501,656 B2 | 3/2009 | Han et al. |
| 7,550,775 B2 | 6/2009 | Okuyama |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,138,493 B2 | 3/2012 | Ohlsson et al. |
| 8,179,938 B2 | 5/2012 | Kim |
| 8,263,987 B2 | 9/2012 | Choi et al. |
| 8,309,439 B2 * | 11/2012 | Seifert et al. ............ 438/478 |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0147453 A1 | 6/2007 | Oohata et al. |
| 2011/0198625 A1* | 8/2011 | Yoon et al. ............ 257/88 |
| 2011/0272723 A1 | 11/2011 | Ha et al. |
| 2012/0153252 A1* | 6/2012 | Kim et al. ............ 257/13 |
| 2013/0112944 A1* | 5/2013 | Cha et al. ............ 257/13 |

FOREIGN PATENT DOCUMENTS

| | | |
|---|---|---|
| JP | 2009-152474 A | 7/2009 |
| JP | 4928886 B2 | 5/2012 |
| KR | 10-2010-0080094 A | 7/2010 |
| KR | 10-2011-0102630 A | 9/2011 |
| KR | 10-2012-0013076 A | 2/2012 |
| KR | 10-2012-0055390 A | 5/2012 |
| KR | 10-2012-0055391 A | 5/2012 |
| KR | 10-2012-0058137 A | 6/2012 |
| KR | 10-2012-0079310 A | 7/2012 |
| KR | 10-2003-0066968 A | 8/2013 |

* cited by examiner

NANO-STRUCTURE SEMICONDUCTOR LIGHT EMITTING DEVICE

CROSS-REFERENCE TO RELATED APPLICATION

This application claims the benefit of Korean Patent Application Nos. 10-2013-0131310 filed on Oct. 31, 2013 and 10-2013-0164521 filed on Dec. 26, 2013, with the Korean Intellectual Property Office, the disclosure of which is incorporated herein by reference.

BACKGROUND

The present disclosure relates to a nano-structure semiconductor light emitting device.

A semiconductor light emitting device such as a light emitting diode (LED) is a device in which materials included therein emit light. In an LED, energy generated according to electron-hole recombination is converted into light to be emitted therefrom. LEDs are widely used as light sources in lighting devices and display devices, and as such, the development thereof has tended to be accelerated.

Recently, semiconductor light emitting devices using nano-structures have been developed as new semiconductor light emitting device technologies. Semiconductor light emitting devices using nano-structures have significantly improved luminous efficiency due to a light emitting area being substantially increased by nano-structures, as well as having enhanced crystal quality. Also, a degradation of efficiency due to piezoelectric poling may be prevented and droop characteristics may also be improved.

However, in a nano-structure, a tip thereof may have a crystal face different from other faces thereof, and in this case, even in the case that an active layer is grown under the same conditions, the active layer positioned in the tip may have a different composition. Thus, light having a wavelength different from that of other regions may be emitted. In addition, a semiconductor layer formed on the tip is relatively thin, having a high possibility of generating a leakage current.

SUMMARY

An aspect of the present disclosure may provide a new nano-structure semiconductor light emitting device capable of solving a leakage current that may be caused in a nano-structure and alleviating a change in a wavelength of emitted light.

One aspect of the present disclosure is a method of manufacturing a light emitting device having a plurality of nano-light emitting structures. The method comprises depositing a first conductivity-type semiconductor material on a substrate to form a base layer. A mask having a plurality of openings is formed on the base layer. The first conductivity-type nitride semiconductor material is deposited in the openings of the mask to form a plurality of nanocores having a main portion bounded by the mask and an exposed tip portion. A current blocking layer is deposited on the tip portion of the nanocores. A portion of the mask is removed to expose the main portion of the nanocore. An active material layer is deposited on the plurality of nanocores. A second conductivity-type nitride semiconductor layer is deposited on the active material layer.

In certain embodiments, the method may further comprises depositing a contact electrode material on the second conductivity-type nitride semiconductor layers of the plurality of nano-light emitting structures to form a contact electrode.

The method may further comprise forming a first electrode contacting the base layer, and forming a second electrode contacting the contact electrode. The method may further comprise depositing an insulating layer on the contact electrode.

In certain embodiments, the method may further comprise depositing a second current blocking layer between the active material layer and the second conductivity-type nitride semiconductor layer.

In certain embodiments of the method, the depositing the current blocking layer comprises depositing an undoped nitride or a nitride doped with a conductivity-type impurity opposite to that of the nanocore conductivity-type material.

In certain embodiments of the method, the forming the mask comprises forming a first mask layer and a second mask layer. The removing a portion of the mask may comprise removing the second mask layer.

Another aspect of the present disclosure is a method of manufacturing a light emitting device having a plurality of nano-light emitting structures. The method comprises depositing a first conductivity-type semiconductor material on a substrate to form a base layer. A mask having a plurality of openings is formed on the base layer. The first conductivity-type nitride semiconductor material is deposited in the openings of the mask to form a plurality of nanocores having a main portion and a tip portion. A portion of the mask is removed to expose the main portion of the nanocore. An active material layer is deposited on the plurality of nanocores. A current blocking layer is deposited on the active material layer, and a second conductivity-type nitride semiconductor layer is deposited on the current blocking layer.

In certain embodiments, the method may further comprise depositing a contact electrode material on the second conductivity-type nitride semiconductor layers of the plurality of nano-light emitting structures to form a contact electrode. The method may further comprise forming a first electrode contacting the base layer, and forming a second electrode contacting the contact electrode. The method may further comprise depositing an insulating layer on the contact electrode material.

In certain embodiments of the method, the depositing the current blocking layer may comprise depositing an undoped nitride or a nitride doped with a conductivity-type impurity opposite to that of the nanocore on the active material layer.

In certain embodiments of the method, the forming the mask may comprise forming a first mask layer and a second mask layer. The removing a portion of the mask may comprise removing the second mask layer.

Another aspect of the present disclosure is a light emitting device having a plurality of nano-light emitting structures, comprising a first conductivity-type nitride semiconductor base layer formed on a substrate. A plurality of nano-light emitting structures spaced apart from each other are formed on the nitride semiconductor base layer. Each nano-light emitting structure comprises a nanocore comprising the first conductivity-type nitride semiconductor having a main portion and a tip portion, an active layer disposed on the nanocore, a second conductivity-type nitride semiconductor layer disposed on the active layer, and a current blocking layer disposed on the tip portion of the nanocore between the nanocore and the active layer.

In certain embodiments, the light emitting device may further comprise a contact electrode disposed on the second conductivity-type nitride semiconductor layers of the plurality of nano-light emitting structures. The light emitting device may further comprise a first electrode contacting the base layer, and a second electrode contacting the contact electrode.

The light emitting device may further comprise an insulating layer disposed on the contact electrode.

In certain embodiments, the light emitting device may further comprise a second current blocking material layer between the active material layer and the second conductivity-type nitride semiconductor layer.

In certain embodiments of the light emitting device the current blocking layer may comprise an undoped nitride or a nitride doped with a conductivity-type impurity opposite to that of the nanocore.

Another aspect of the present disclosure is a light emitting device having a plurality of nano-light emitting structures. The light emitting device comprises a first conductivity-type nitride semiconductor base layer formed on a substrate, and a plurality of nano-light emitting structures spaced apart from each other formed on the nitride semiconductor base layer. Each nano-light emitting structure comprises a nanocore comprising the first conductivity-type nitride semiconductor having a main portion and a tip portion, an active layer disposed on the nanocore, and a second conductivity-type nitride semiconductor layer disposed on the active layer. When a current applied to the light emitting device is increased from 10 mA to 120 mA, the change in a peak wavelength of light emitted by the device is less than 25 nm.

In certain embodiments, the light emitting device may further comprise a contact electrode disposed on the second conductivity-type nitride semiconductor layers of the plurality of nano-light emitting structures. The light emitting device may further comprise a first electrode contacting the base layer, and a second electrode contacting the contact electrode. The light emitting device may further comprise an insulating layer disposed on the contact electrode.

Another aspect of the present disclosure is a light emitting device having a plurality of nano-light emitting structures. The light emitting device comprises a first conductivity-type nitride semiconductor base layer formed on a substrate, and a plurality of nano-light emitting structures spaced apart from each other formed on the nitride semiconductor base layer. Each nano-light emitting structure comprises a nanocore comprising the first conductivity-type nitride semiconductor having a main portion and a tip portion, an active layer disposed on the nanocore, a second conductivity-type nitride semiconductor layer disposed on the active layer, and a current blocking layer disposed on the tip portion of the nanocore between the nanocore and the active layer. The nanocore, active layer, and second conductivity-type nitride layer each have two crystal growth directions.

In certain embodiments, the light emitting device may further comprise a contact electrode disposed on the second conductivity-type nitride semiconductor layers of the plurality of nano-light emitting structures. The light emitting device of claim 26, may further comprise a first electrode contacting the base layer, and a second electrode contacting the contact electrode. The light emitting device may further comprise an insulating layer disposed on the contact electrode.

In certain embodiments, the light emitting device may further comprise a second current blocking material layer between the active material layer and the second conductivity-type nitride semiconductor layer.

In certain embodiments of the light emitting device, the tip portion may comprises a plurality of surfaces with a tilted crystal growth face relative to the crystal grown face of the main portion.

In certain embodiments of the light emitting device, the tip portion has a hexagonal pyramidal shape.

In certain embodiments of the light emitting device, the current blocking layer comprises an undoped nitride or a nitride doped with a conductivity-type impurity opposite to that of the nanocore.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
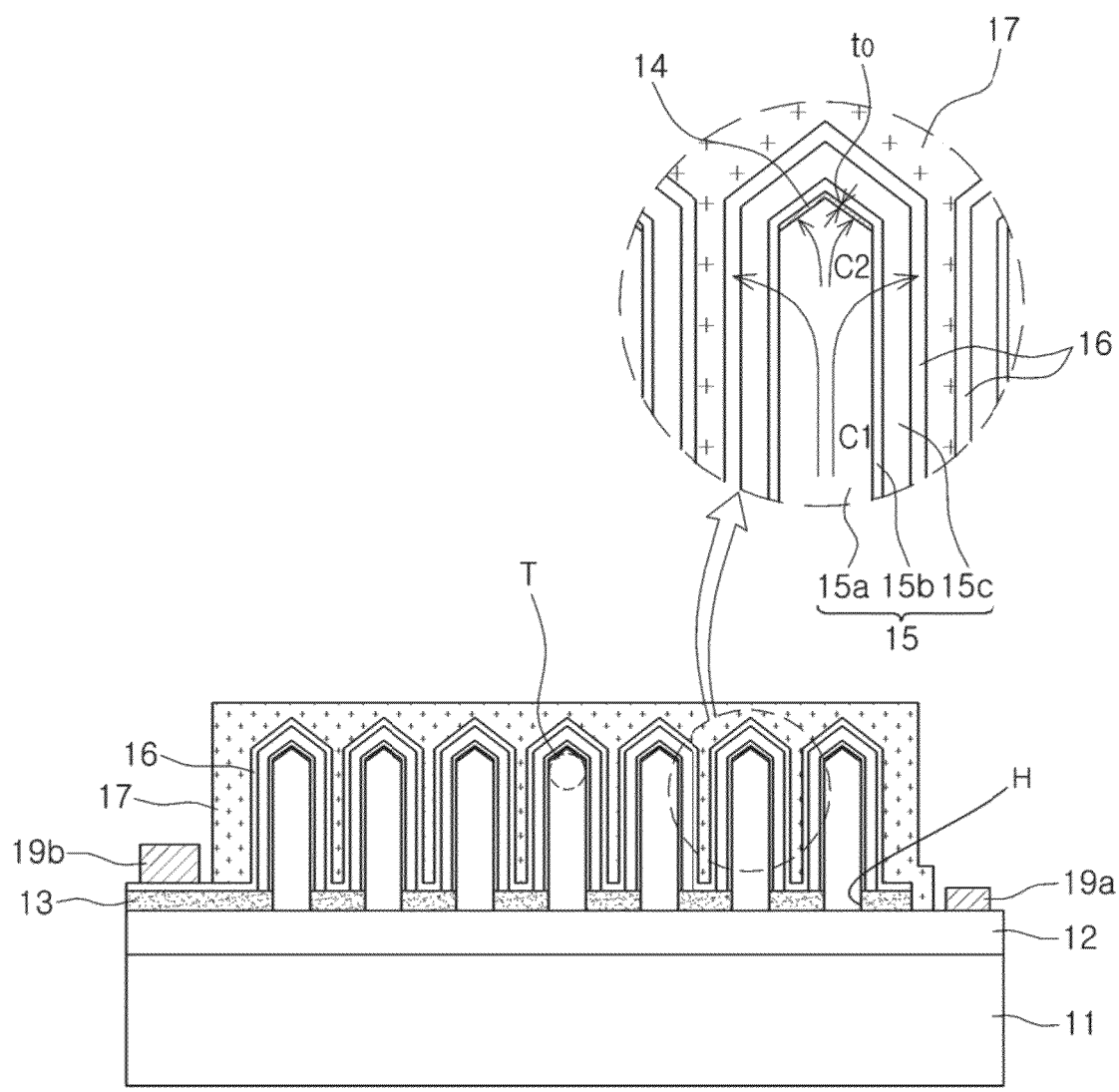
FIG. 1 is a cross-sectional view illustrating a nano-structure semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view illustrating a nano-structure semiconductor light emitting device according to an exemplary embodiment of the present disclosure.

As illustrated in FIG. 1, a nano-structure semiconductor light emitting device 10 according to the present exemplary embodiment includes a base layer 12 formed of a first conductivity-type semiconductor material and a plurality of nano-light emitting structures 15 formed on the base layer 12.

The base layer 12 may be formed on a substrate 11 to provide a growth surface for the nano-light emitting structures 15 and serve to electrically connect polarity of one side of the nano-light emitting structures 15.

The substrate 11 may be an insulating, conductive, or semiconductor substrate. For example, the substrate 11 may be formed of sapphire, SiC, Si, $MgAl_2O_4$, MgO, $LiAlO_2$, $LiGaO_2$, or GaN. The base layer 12 may be a nitride semiconductor satisfying $Al_xIn_yGa_{1-x-y}N$ ($0 \leq x < 1$, $0 \leq y < 1$, $0 \leq x+y < 1$) and may be doped with an n-type impurity such as silicon (Si) to have a particular conductivity type.

An insulating layer 13 may be formed on the base layer 12 having openings H allowing nano-light emitting structures 15 (in particular, nanocores) to grow therein. The base layer 12 is exposed through the openings, and nanocores 15a may be formed in the exposed regions. The insulating layer 13 may be used as a mask for growing the nanocores 15a. The insulating layer 13 may be formed of an insulating material such as $SiO_2$ or $SiN_x$ that may be used in a semiconductor process.

The nano-light emitting structures 15 may include the nanocore 15a formed of a first conductivity-type semiconductor and an active layer 15b and a second conductivity-type semiconductor layer 15c sequentially formed on a surface of the nanocore 15a.

The nanocore 15a may be a nitride semiconductor layer satisfying n-type $Al_xIn_yGa_{1-x-y}N$ ($0 \leq x < 1$, $0 \leq y < 1$, $0 \leq x+y < 1$) similar to that of the base layer 12. For example, the nanocore 15a may be formed of n-type GaN. The active layer 15b may have a multi quantum well (MQW) structure in which quantum well layers and quantum barrier layers are alternately stacked. For example, in case of a nitride semiconductor, a GaN/InGaN structure may be used. The active layer 94 may also have a single quantum well (SQW) structure. The second conductivity-type nitride semiconductor layer 15c may be a crystal satisfying p-type $Al_xIn_yGa_{1-x-y}N$ ($0 \leq x < 1$, $0 \leq y < 1$, $0 \leq x+y < 1$).

The nano-structure semiconductor light emitting device 10 may include a contact electrode 16 in ohmic-contact with the second conductivity-type nitride semiconductor layer 15c. The contact electrode 16 employed in the present exemplary embodiment may be formed of a transparent electrode material to emit light toward the nano-light emitting structures (in the direction opposite to the substrate side). For example, the contact electrode 16 may be formed of a transparent electrode material such as indium tin oxide (ITO), and formed of graphene, as needed.

The contact electrode 16 may include materials such as Ag, Ni, Al, Rh, Pd, Ir, Ru, Mg, Zn, Pt, Au, or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like, but the present disclosure is not limited thereto. A reflective electrode structure may be implemented as a flip chip structure, as needed.

An insulating protective layer 17 may be formed on upper surfaces of the nano-light emitting structures 15. The insulating protective layer 17 may be a passivation layer protecting the nano-light emitting structures 15. In the present exemplary embodiment, even after the contact electrode 16 is formed, a space exists between the plurality of nano-light emitting structures, so, the insulating protective layer 17 may be formed to fill the space. The insulating protective layer 17 may be formed of an insulating material such as $SiO_2$ or $SiN_x$. In detail, the insulating protective layer 17 may be formed of tetraethylorthosilane (TEOS), borophosphor silicate glass (BPSG), CVD-$SiO_2$, spin-on glass (SOG), or a spin-on dielectric (SOD) material in order to easily fill the space between the nano-light emitting structures 15.

However, the filling using the insulating protective layer 17 is not limited thereto. For example, in a different configuration, an electrode element related to the contact electrode 16 may fill the entirety or a portion of the space between the nano-light emitting structures 15.

The nano-structure semiconductor light emitting device 10 may include first and second electrodes 19a and 19b. The first electrode 19a may be disposed in a partially exposed region of the base layer 12 formed of the first conductivity-type semiconductor. Also, the second electrode 19b may be disposed in an exposed portion of an extended region of the contact electrode 16.

As illustrated in FIG. 1, the nanocore 15a has a tip portion T having a crystal face different from surfaces of other regions. As illustrated in FIG. 1, unlike the lateral surface of the nanocore 15, the tip portion T may have a sloped crystal face. For example, the tip portion T of the nanocore 15 may have a hexagonal pyramid shape.

A current blocking intermediate layer 14 may be formed on a surface of the tip portion T of the nanocore 15a. The current blocking intermediate layer 14 may be positioned between the active layer 15b and the nanocore 15a.

The current blocking intermediate layer 14 may be formed of a material having high electrical resistance to block a leakage current that may be caused in the tip portion T of the nanocore 15a. For example, the current blocking intermediate layer 14 may be a semiconductor layer not doped on purpose or may be a semiconductor layer doped with a second conductivity-type impurity opposite to that of the nanocore 15a. For example, in a case in which the nanocore 15a is n-type GaN, the current blocking intermediate layer 14 may be undoped GaN or GaN doped with a p-type impurity such as magnesium (Mg). The current blocking intermediate layer 14 may be a high resistance region formed of the same material (for example GaN) but implemented with various doping concentrations or doping materials, without being particularly discriminated from an adjacent layer. For example, GaN may be grown, while an n-type impurity is supplied thereto, to form the nanocore 15a and here, GaN may continue to be grown, while preventing supply of the n-type impurity or while a p-type impurity such as magnesium (Mg) is supplied thereto, to form a desired current blocking intermediate layer 14. Also, while GaN, nanocore 15a, is being grown, a source of aluminum (Al) and/or indium (In) may be additionally supplied to form a current blocking intermediate layer 14 formed of a different composition $Al_xIn_yGa_{1-x-y}N(0 \leq x < 1, 0 \leq y < 1, 0 \leq x+y < 1)$.

When the current blocking intermediate layer 14 is formed as a semiconductor layer, it may have a thickness equal to or greater than approximately 50 nm to have sufficient electrical resistance. The second conductivity-type impurity of the current blocking intermediate layer 14 may be approximately $1.0 \times 10^{16}/cm^3$ or more. In the case of the current blocking intermediate layer 14 doped with the second-conductivity type impurity, a thickness and concentration thereof may be appropriately implemented to be complementary to each other. For example, when the thickness is small, doping concentration may be increased to secure resistance, and vice versa.

The current blocking intermediate layer 14 employed in the present exemplary embodiment is limitedly disposed only on the tip portion T of the nanocore 15a. Due to the selective disposition of the current blocking intermediate layer 14, the active region positioned on the surface of the tip portion T of the nanocore 15a may not substantially contribute to light emission. Namely, a current flow through the active layer region formed on lateral surface of the nanocore 15a is normally guaranteed, while a current flow through the active layer region formed on the tip portion T of the nanocore 15a may be blocked by the current blocking intermediate layer 14.

In this manner, since only the active layer region formed on the same crystal face (lateral surface) contribute to substantial light emission, even if the active layer region positioned on the different crystal face (tip portion) has a different composition ratio, influence thereof on a wavelength of emitted light (for example, an increase in half-width) may be minimized, and as a result, a desired wavelength of emitted light may be accurately designed.

Influence according to a crystal face of a nanocore that may be employed in the present exemplary embodiment will be described in detail with reference to FIGS. 2A and 2B.

A nanocore 25 may be divided into a main part M providing a lateral surface having a first crystal face and a tip portion T providing a surface having a second crystal face different from the first crystal face depending on growth directions.

In a case in which the nanocore 25 has a crystal structure having a hexagonal system such as a nitride single crystal, the first crystal face may be a non-polar face (m face) and the second crystal face may be a plurality of non-polar faces (r faces). Similar to the nanocore 15a described with reference to FIG. 1, the nanocore 25 may have a rod structure in which the tip portion T has a hexagonal pyramidal shape Even in the case that an active layer is grown on the surface of the nanocore 25 using the same process, compositions of the active layer (in particular, the content of indium when InGaN layer is grown) are varied due to the difference between the characteristics of respective crystal faces, and a wavelength of light generated by the active layer portion grown on the surface (r face) of the tip portion of the nanocore 25 and a wavelength of light generated by the lateral surface (m face) of the nanocore 25 may be different. As a result, a half-width of the wavelength of emitted light is increased, making it difficult to accurately design light having a desired wavelength. Also, since semiconductor layers (active layer and second conductivity-type semiconductor layer) are grown to be relatively thin in the tip portion as a non-polar face, a leakage current may be concentrated.

In order to solve this problem, as illustrated in FIG. 1, the current blocking intermediate layer 14 is formed in the tip portion of the nanocore to reduce a leakage current to enhance luminous efficiency, and since the active layer portion positioned in the tip portion is not active in light emissions, a wavelength of emitted light may be accurately designed.

Figure 2A:
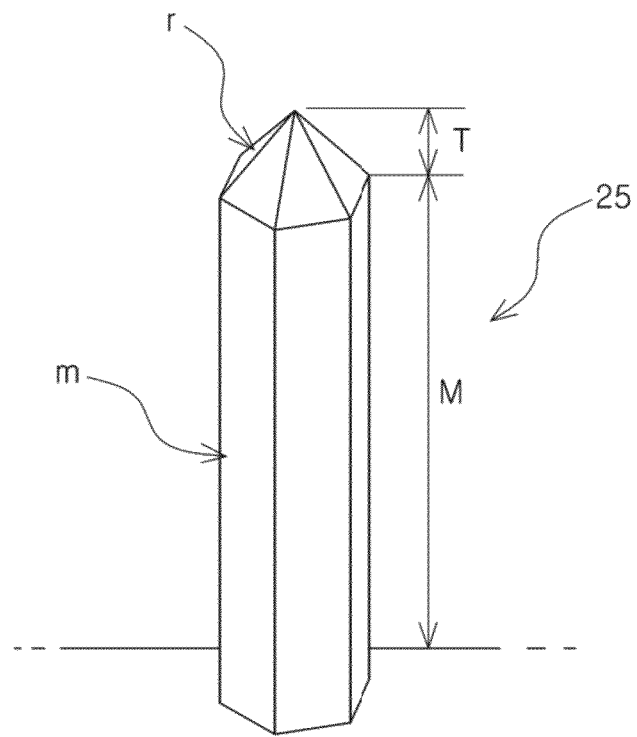
FIGS. 2A and 2B are perspective views schematically illustrating examples of a nanocore employed in an exemplary embodiment of the present disclosure.

Besides the nanocore illustrated in FIG. 2A, the foregoing current blocking intermediate layer may also be advantageously applied to nanocores having various crystal structures and shapes in which a particular region has a different crystal face. For example, as illustrated in FIG. 2B, even when the tip portion of the nanocore is not a non-polar face, the current blocking intermediate layer may be similarly applied.

Figure 2B:
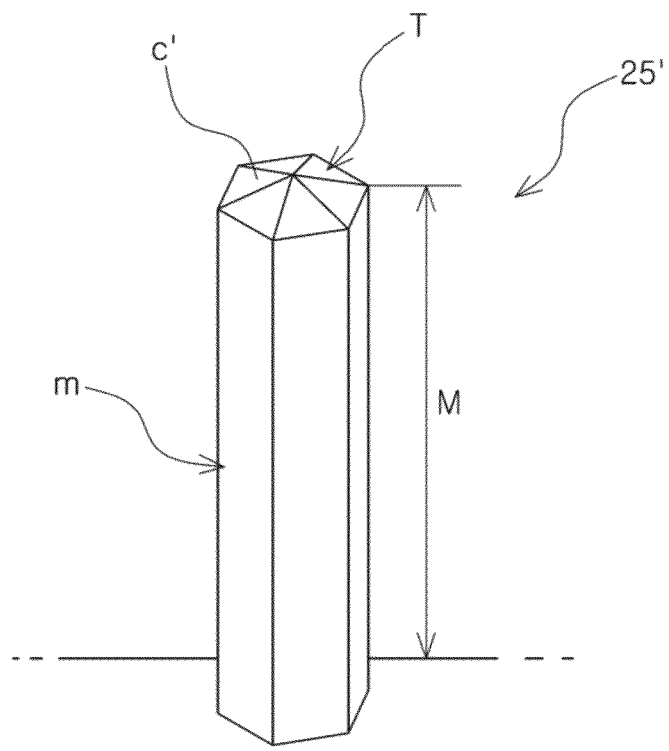

As illustrated in FIG. 2B, similar to the case of FIG. 2A, a nanocore 25' has a main part M providing a lateral surface having a first crystal face m, while a tip portion T is a crystal face c' different from the first crystal face m, but it is not a completely non-polar face.

Even in this configuration, an active layer may have different compositions and grown semiconductor layers have different thicknesses due to the difference in the characteristics of respective crystal faces, making different wavelengths in emitted light and causing a leakage current. In this case, by applying the current blocking intermediate layer 14 as described above with reference to FIG. 1 to the tip portion T of the nanocore 25' before an active layer is grown, a current flow from the tip portion T of the nanocore 25' to the active layer may be suppressed. As a result, a problem caused by generation of a leakage current and a difference in wavelengths of emitted light may be addressed to provide a highly efficient nano-structure semiconductor light emitting device.

The nano-structure semiconductor light emitting device according to the present exemplary embodiment may be manufactured through various manufacturing methods. FIGS. 3A through 3E illustrate an example of a method of manufacturing a nano-structure semiconductor light emitting device, in particular, illustrating a process of growing nanocores such that the nanocores are charged using a mask as a mold structure.

Figure 3A:
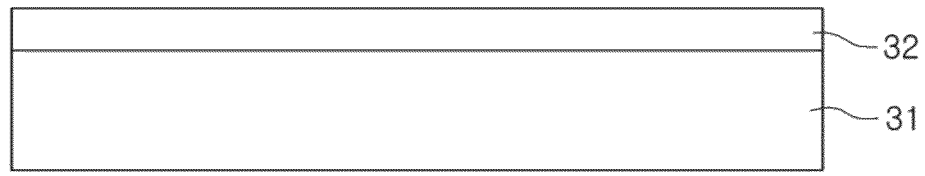
FIGS. 3A through 3E are cross-sectional views illustrating major processes of an example of a method of manufacturing a nano-structure semiconductor light emitting device according to an exemplary embodiment of the present disclosure.

As illustrated in FIG. 3A, a first conductivity-type semiconductor may be grown on a substrate 31 to provide a base layer 32.

The base layer 32 provides a crystal growth face for growing nano-light emitting structures and serves to electrically connect polarities of one sides of the nano-light emitting structures. Thus, the base layer 32 may be formed as a semiconductor single crystal having electrical conductivity. When the base layer 32 is directly grown, the substrate 31 may be a crystal growth substrate. Before the base layer 32 is grown, a multilayer structure including a buffer layer formed of $Al_xIn_yGa_{1-x-y}N$ ($0 \leq x \leq 1$, $0 \leq y \leq 1$, $0 \leq x+y \leq 1$) may be additionally formed on the substrate 31. The multilayer structure may include intermediate layers composed of an undoped GaN layer and AlGaN layer or combinations thereof, preventing current leakage to the buffer layer from the base layer 32 and enhancing crystal quality of the base layer 32.

Figure 3B:
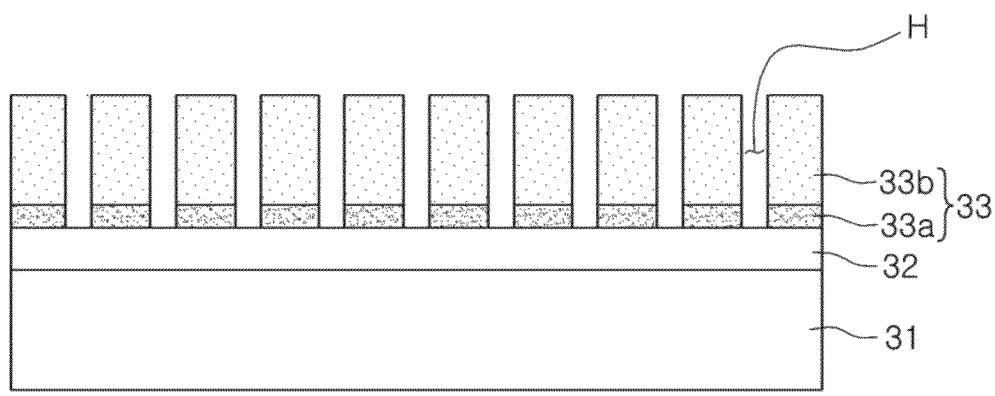

Subsequently, as illustrated in FIG. 3B, a mask 33 having a plurality of openings H and including an etch-stop layer is formed on the base layer 32.

The mask 33 employed in the present exemplary embodiment may include a first material layer 33a formed on the base layer 32 and a second material layer 33b formed on the first material layer 33a and having an etching rate greater than that of the first material layer 33a.

The first material layer 33a may be provided as the etch-stop layer. Namely, the first material layer 33a has an etching rate lower than that of the second material layer 33b under etching conditions of the second material layer 33b. The first material layer 33a may be formed of at least a material having electrical insulation properties, and the second material layer 33b may also be formed of an insulating material as needed.

The first and second material layers 33a and 33b may be formed of different materials to obtain a desired difference in etching rates. For example, the first material layer 33a may be formed of a SiN-based material, while the second material layer 33b may be formed of $SiO_2$. Alternatively, a difference in etching rates may be implemented using air gap density. The second material layer 33b or both the first and second material layers 33a and 33b may be formed of a porous material, and a difference in etching rates between the first and second material layers 33a and 33b may be secured by adjusting a difference in porosity. In this case, the first and second material layers 33a and 33b may be formed of the same material. For example, the first material layer may be formed of $SiO_2$ having first porosity and the second material layer 33b may be formed of $SiO_2$ but with second porosity greater than the first porosity. Accordingly, under conditions in which the second material layer 33b is etched, the first material layer 33a may have an etching rate lower than that of the second material layer 33b.

A total thickness of the first and second material layers 33a and 33b may be designed in consideration of height of a desired nano-light emitting structure. An etch stop level by the first material layer 33a may be designed in consideration of a total height of the mask 33 from a surface of the base layer 32. After the first and second material layers 33a and 33b are sequentially formed on the base layer 32, a plurality of openings H are formed to expose the base layer 32 region. The openings H may be formed by forming photoresist on the mask layer 33 and performing lithography and a wet/dry etching process thereon. A size of each opening H may be designed in consideration of a size of a desired nano-light emitting structure. For example, each opening H exposing the surface of the base layer 32 may have a width (diameter) equal to or smaller than 600 nm, further, range from 50 nm to 500 nm.

Each opening H may be formed using a semiconductor process, and for example, each opening H having a high aspect ratio may be formed using a deep-etching process. The aspect ratio of each opening H may be equal to or greater than 5:1, further, equal to or greater than 10:1

Figure 9:
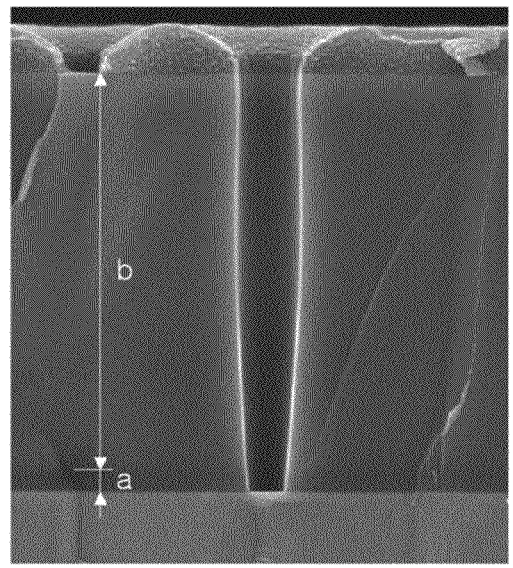
FIG. 9 is a scanning electron microscope (SEM) photograph obtained by imaging a mask employed in an Experimental Example.

While varied depending on etch conditions, in general, each opening H in the first and second material layers 33a and 33b may have a width decreased toward the base layer 32 (please refer to Experimental Example and FIG. 9).

In general, a dry etching process is used as the deep-etching process, and reactive ions generated from plasma or ion beams generated in high vacuum may be used. Compared to wet etching, dry etching allows for precision machining on a micro-structure without geometric constraints. A CF-based gas may be used for oxide film etching of the mask 33. For example, an etchant obtained by combining at least one of $O_2$ and Ar with a gas such as $CF_4$, $C_2F_6$, $C_3F_8$, $C_4F_8$, or $CHF_3$ may be used.

Figure 4A:
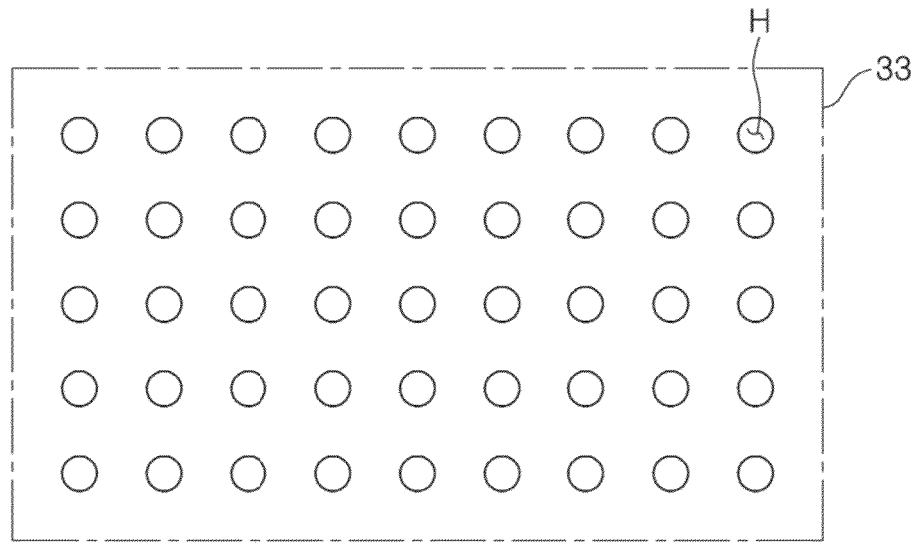
FIGS. 4A and 4B are plan views illustrating various examples of a mask with an opening having various shapes.
Figure 4B:
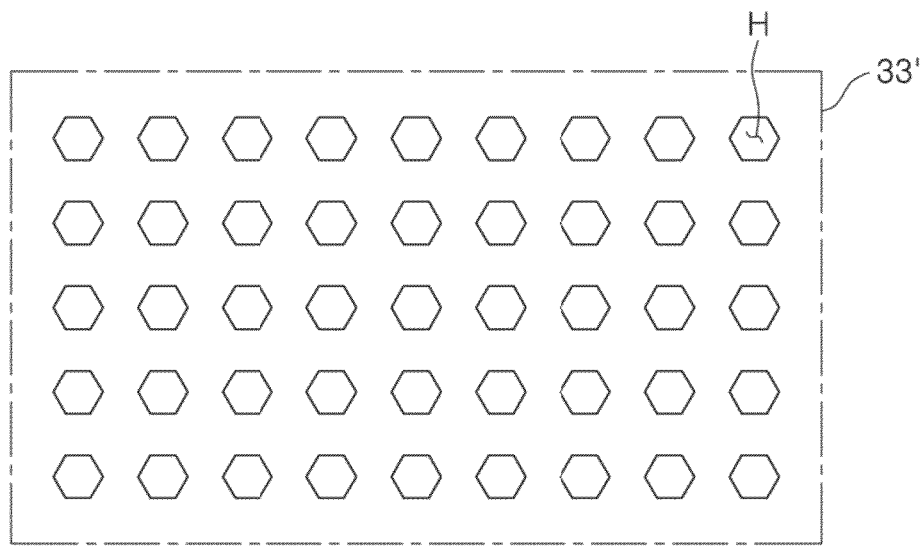

A planar shape and arrangement of the openings H may be variously implemented. For example, in case of a planar shape, the openings H may be implemented to have various shapes such as polygonal, square, oval, and circular shapes. The mask 33 illustrated in FIG. 3B may have an array of openings H having a circular cross-section as illustrated in FIG. 4A, but the mask 33 may have any other shapes and arrangements as needed. For example, the mask 33 may have an array of openings having a regular hexagonal cross-section, like a mask 33' as illustrated in FIG. 4B.

Figure 5A:
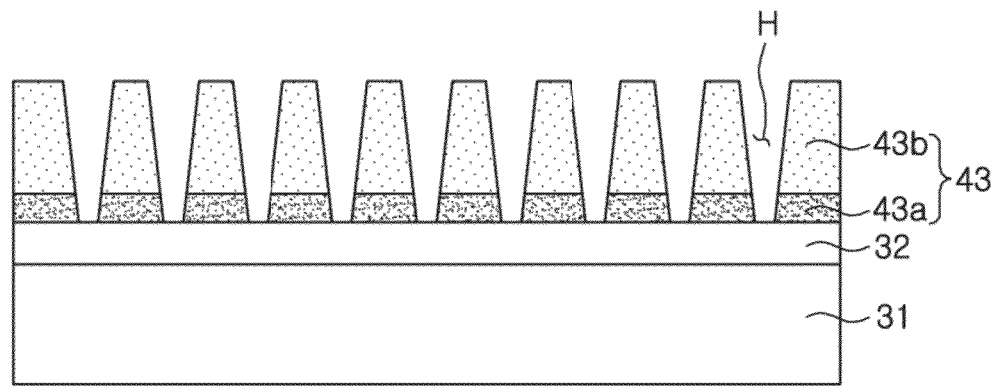
FIGS. 5A and 5B are cross-sectional views illustrating various examples of a mask with an opening having various shapes.
Figure 5B:
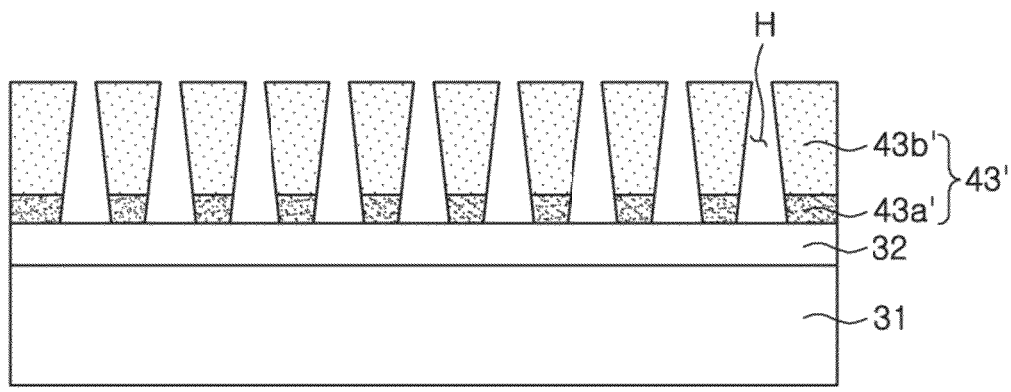

The openings H illustrated in FIG. 3 may have a rod structure having a uniform diameter (or width), but the present disclosure is not limited thereto and the openings H may have various other structures using an appropriate etching process. For example, masks having different shapes are illustrated in FIGS. 5A and 5B. In the case of FIG. 5A, a mask 43 including first and second material layers 43a' and 43b' may have openings H having a columnar shape having a cross-section decreased towards an upper portion thereof.

Figure 3C:
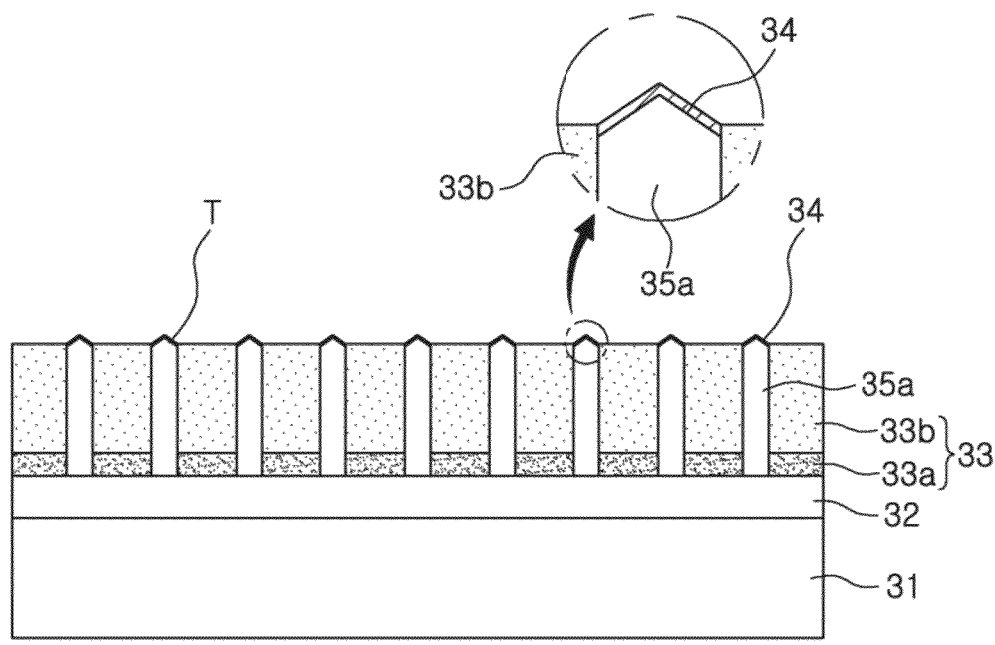

Thereafter, as illustrated in FIG. 3C, a first conductivity-type semiconductor is grown on the exposed regions of the base layer 32 to fill the plurality of openings H, thus forming a plurality of nanocores 35a, and a current blocking intermediate layer 34 is subsequently formed on tip portions T of the nanocores 35a.

The first conductivity-type semiconductor of the nanocores 35 may be an n-type nitride semiconductor and may be a material identical to that of the first conductivity-type semiconductor of the base layer 32. For example, the base layer 32 and the nanocores 35a may be formed of n-type GaN.

A nitride single crystal constituting the nanocore 35a may be formed using a metal-organic chemical vapor deposition (MOCVD) or molecular beam epitaxy (MBE), and in this case, the mask 33 acts as a mold of the grown nitride single crystal to provide nanocores 35 corresponding to the shape of the openings H. Namely, the nitride single crystal may be selectively grown on the regions of the base layer 32 exposed by the openings H, filling (or charging) the openings H, and the charged nitride single crystal may have a shape corresponding to that of the openings H.

With the mask 33 left as it is, the current blocking intermediate layer 34 is formed on surfaces of tip portions T of the nanocores 35a. Thus, the current blocking intermediate layer 34 may be easily formed on the desired tip portions T, even without performing a process of forming an additional mask.

The current blocking intermediate layer 34 may be a semiconductor layer not doped on purpose or may be a semiconductor layer doped with a second conductivity-type impurity opposite to that of the nanocores 35a. For example, in a case in which the nanocores 35a are n-type GaN, the current blocking intermediate layer 34 may be undoped GaN or may be GaN doped with a p-type impurity such as magnesium (Mg). In this case, the nanocores 35a and the current blocking intermediate layer 34 may be continuously formed by changing only the types of impurity during the same growth process. In this manner, the process of forming the current blocking intermediate layer 34 and the mold process are combined to further simplify the overall process.

Figure 3D:
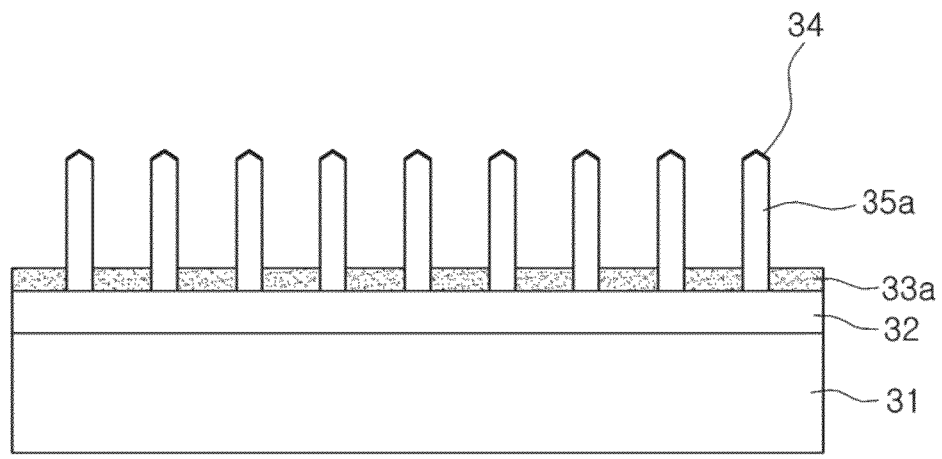

Subsequently, as illustrated In FIG. 3D, the first material layer 33a, an etch-stop layer, of the mask 33 is removed such that lateral surfaces of the plurality of nanocores 35a are partially exposed.

In the present exemplary embodiment, by applying an etching process of selectively removing the second material layer 33b, only the second material layer 33b may be removed, while the first material layer 33a is left. The residual first material layer 33a may serve to prevent the active layer 35b and the second conductivity-type semiconductor layer 35c from being connected to the base layer 32 in a follow-up growth process.

In the present exemplary embodiment, an additional heat treatment process may be introduced during the process of forming the nano-light emitting structures using the mask having openings as a mold in order to enhance crystallinity.

First, before the forming of the current blocking intermediate layer 34, a stabilizing process (heat treatment process) may be performed while the nanocores 35a are being grown to enhance crystal quality of the nanocores 35a. Namely, when the nanocores 35a are grown to reach a desired growth intermediate point (a height ranging from approximately 0.2 μm to 1.8 μm from the base layer), supply of a TMGa source, a Group-III element source of GaN, may be stopped and a heat treatment may be performed at a temperature (ranging from approximately 1000° C. to 1200° C.) similar to that of the substrate during the growth for approximately 5 seconds to five minutes under an NH$_3$ atmosphere.

Also, after the nanocores 35a are completely grown and the upper layer 33b of the mask 33 is removed, the surfaces of the nanocores 35a may be heat-treated under predetermined conditions to change a crystal face of each nanocore 35a into a stable face advantageous for crystal growth, like a non-polar or polar crystal face. This process will be described with reference to FIGS. 6A and 6B.

Figure 6A:
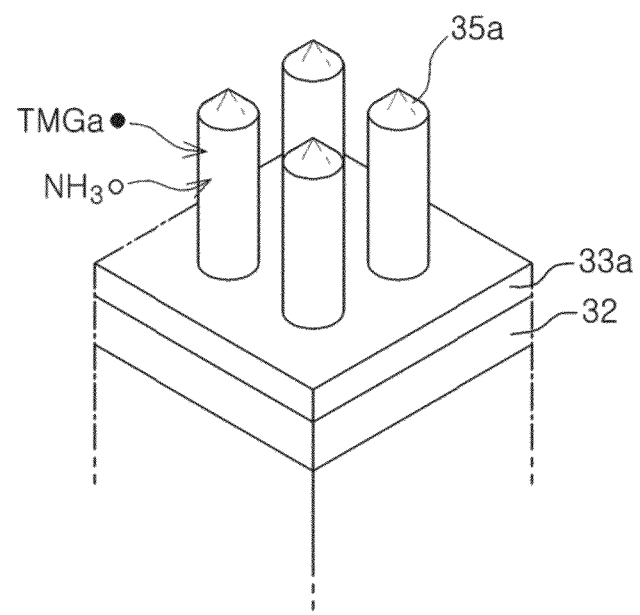
FIGS. 6A and 6B are schematic views illustrating a heat treatment process applicable to FIG. 3D.
Figure 6B:
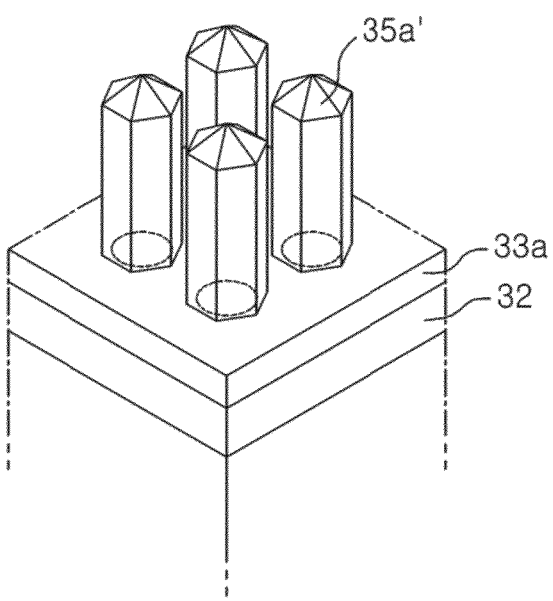

FIGS. 6A and 6B are schematic views illustrating a heat treatment process applicable to the process of FIG. 3D.

FIG. 6A illustrates the nanocores 35a obtained in FIG. 3D. The nanocores 35a have a crystal face determined depending on the shape of the openings. Although differed depending on the shape of openings, in general, the surfaces of the nanocores 35a obtained thusly may have a relatively unstable crystal face, which is not a good condition advantageous for a follow-up crystal growth.

In the present exemplary embodiment, when the openings have a cylindrical rod shape, the lateral surface of each nanocore 35a may be a curved surface, rather than a particular crystal face.

When such nanocores are heat-treated, unstable crystals on the surface thereof are rearranged to have a stable crystal face such as a non-polar or polar face. As for heat treatment conditions, the nanocores may be heat-treated at a temperature equal to or greater than 600° C., and in a specific example, at a temperature ranging from 800° C. to 1200° C., for a few seconds to tens of minutes (1 second to 60 minutes) to have a desired stable crystal faces.

In the heat treatment process, if the substrate temperature is lower than 600° C., it is difficult to grow and rearrange crystals of the nanocores, making it difficult to obtain a heat treatment effect, and if the substrate temperature is lower than 1200° C., nitrogen (N) is evaporated from the GaN crystal faces to degrade crystal quality. Also, for a period of time shorter than 1 second, it is difficult to obtain a sufficient heat treatment effect, and a heat treatment performed for tends of minutes, for example, for a period of time longer than 60 minutes, may degrade the efficiency of manufacturing process.

For example, when the nanocores 35a are grown on a C(0001) face of a sapphire substrate ((111) face in case of a silicon substrate), the nanocores 35a having a cylindrical shape may be heat-treated at an appropriate temperature range as mentioned above to change a curved surface (lateral surface), an unstable crystal face, into hexagonal crystal column (35a' in FIG. 6B) having a non-polar face (m face) as a stable crystal face. Stabilization of the crystal face may be realized through the heat treatment process performed at a high temperature.

It is difficult to clearly explain the principle, but it may be understood that, when crystals positioned on the surface are rearranged at a high temperature or a source gas remains within a chamber, such a residual source gas is deposited to perform partial regrowth to have a stable crystal face.

In particular, in view of regrowth, a heat treatment process may be performed under an atmosphere with a residual source gas in a chamber, or a heat treatment process may be performed under conditions that a small amount of source gas is supplied on purpose. For example, as illustrated in FIG. 6A, in case of an MOCVD chamber, TMGa and NH$_3$ remain and a heat treatment process is performed under the atmosphere with the residual TMGa and NH$_3$ to allow the source gas to be reacted on the surface of nanocores to perform partial regrowth to have a stable crystal face. Due to this regrowth, widths of the heat-treated nanocores 35a' may be slightly increased, relative to those of the nanocores 35a prior to the heat treatment process (please refer to FIGS. 6A and 6B).

In this manner, crystallinity of the nanocores may be enhanced by introducing the additional heat treatment process. Namely, through the heat treatment process, non-uniformity (for example, a defect, or the like) present on the surfaces of nanocores after the removal of the mask may be removed and stability of the internal crystals may be greatly enhanced through rearrangement. The heat-treatment process may be performed under conditions similar to those of the growth process of the nanocores within a chamber after the removal of the mask. For example, the heat treatment process may be performed at a temperature (for example, substrate temperature) ranging from 800° C. to 1200° C., but a similar effect may also be obtained even with a heat treatment process performed at a temperature equal to or higher than 600° C.

Figure 3E:
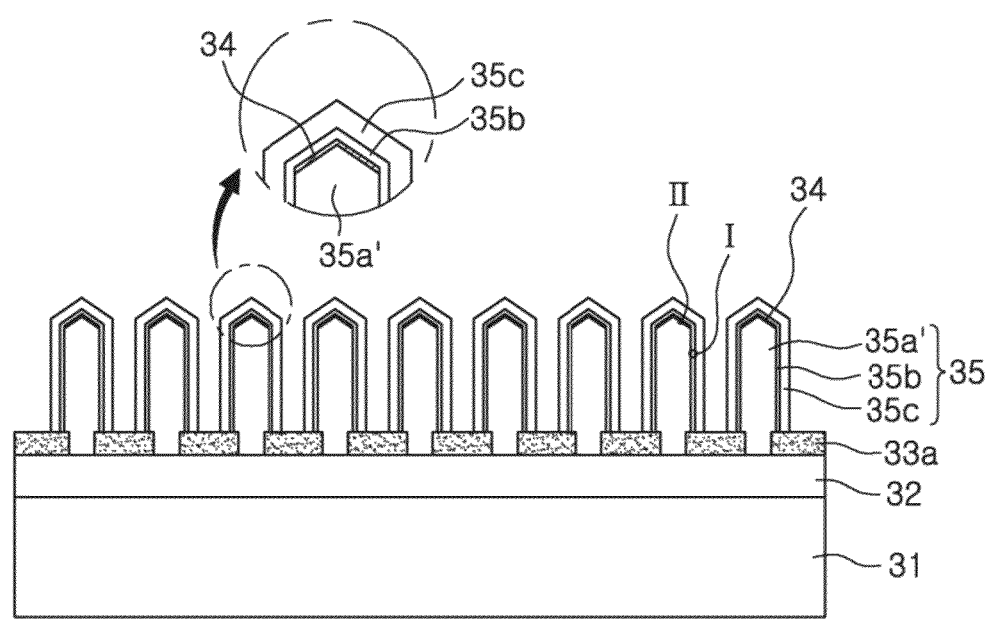

Subsequently, as illustrated in FIG. 3E, the active layer 35b and the second conductivity-type semiconductor layer 35c are sequentially grown on the surfaces of the plurality of nanocores 35a'.

Through this process, each nano-light emitting structure 35 may have a core-shell structure including the nanocore 35a' formed of the first conductivity-type semiconductor, the active layer 35b covering the nanocore 35a', and a shell layer formed of the second conductivity-type semiconductor layer 35b.

The nanocore 35a' may have a tip portion having a different crystal face from that of the lateral surface thereof, and as mentioned above, portions II of the active layer 35b and the second conductivity-type semiconductor layer formed on the tip portion and the portions I of the active layer and the second conductivity-type semiconductor layer may have different compositions and/or thicknesses. In order to address a leakage current and a problem of a wavelength in emitted light, the current blocking intermediate layer 34 is disposed on the tip portion of the nanocore 35a. Due to the selective disposition of the current blocking intermediate layer 34, a current flow through the active region formed on the tip portion of the nanocore 35a' may be blocked by the current blocking intermediate layer 34, while normally guaranteeing a current flow through the active layer region formed on the lateral surface of the nanocore 35a'.

Accordingly, a leakage current concentrated on the tip portion of the nanocore 35a' may be suppressed, enhancing efficiency, and a desired wavelength of emitted light may be accurately designed.

The mask employed in the exemplary embodiment as described above includes the two material layers, but the present disclosure is not limited thereto and the mask may also be implemented to have three or more layers.

For example, in case of a mask having first to third material layers sequentially formed on the base layer, the second material layer, as an etch-stop layer, may be formed of a material different from those of the first and third material layers. The first to third material layers may be formed of the same material as needed.

Under etch conditions of the third material layer, at least the second material layer has an etching rate lower than that of the third material layer, so the second material layer may act as an etch-stop layer. The at least first material layer may be formed of a material having electrical insulation properties, and the second or third material layer may also be formed of an insulating material as needed.

In the nano-structure semiconductor light emitting device illustrated in FIG. 3E, electrodes having various structures may be formed. FIGS. 7A through 7E are cross-sectional views illustrating major processes of an example of forming an electrode.

Figure 7A:
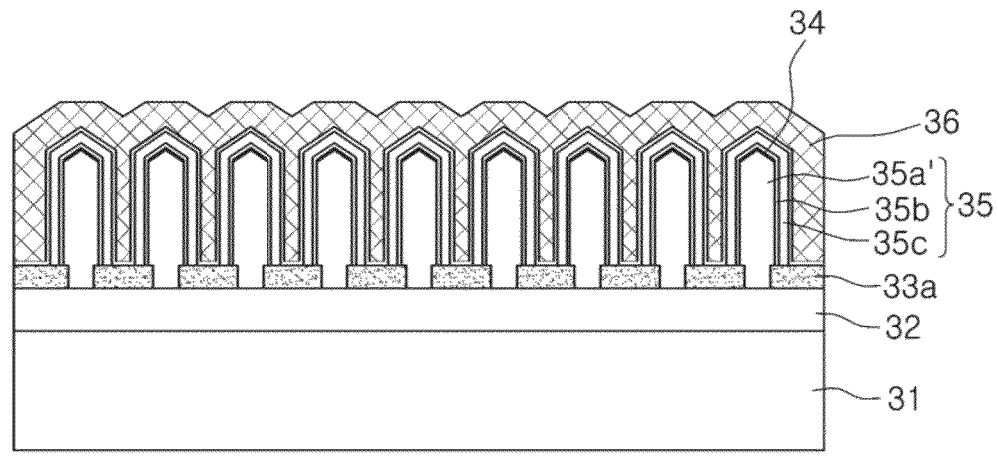
FIGS. 7A through 7E are cross-sectional views illustrating major processes of forming an electrode with respect to the product illustrated in FIG. 3E.

First, as illustrated in FIG. 7A, a contact electrode 36 is formed on the nano-light emitting structures 35 obtained in FIG. 3E.

The contact electrode 36 may include an appropriate material implementing ohmic-contact with the second conductivity-type semiconductor layer 35c on surfaces of the nano-light emitting structures 35. The material for ohmic-contact may include at least one of materials such as ITO, ZnO, a graphene layer, Ag, Ni, Al, Rh, Pd, Ir, Ru, Mg, Zn, Pt, and Au, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. In a specific example, the contact electrode 36 illustrated in FIG. 7A may be formed by applying an electroplating process to the material for ohmic-contact used as a seed layer. For example, after Ag/Ni/Cr layers are formed as seed layers, Cu/Ni may be plated to form the desired contact electrode 36.

The contact electrode 36 used in the present exemplary embodiment may be a reflective metal layer to extract light in a direction toward the substrate, but the present disclosure is not limited thereto and the contact electrode 36 may be formed of a transparent electrode material such as indium tin oxide (ITO) to extract light in a direction toward the nano-light emitting structures 35.

Figure 7B:
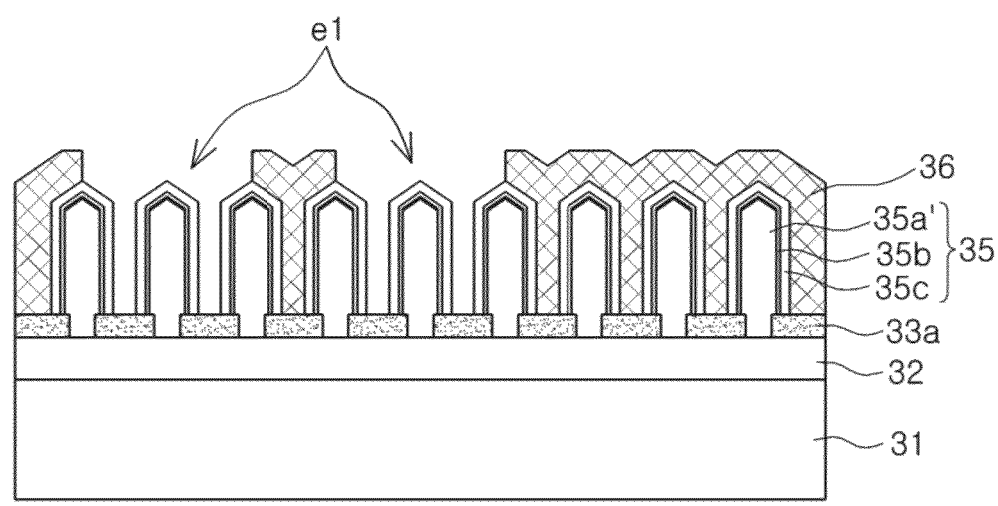
Figure 7C:
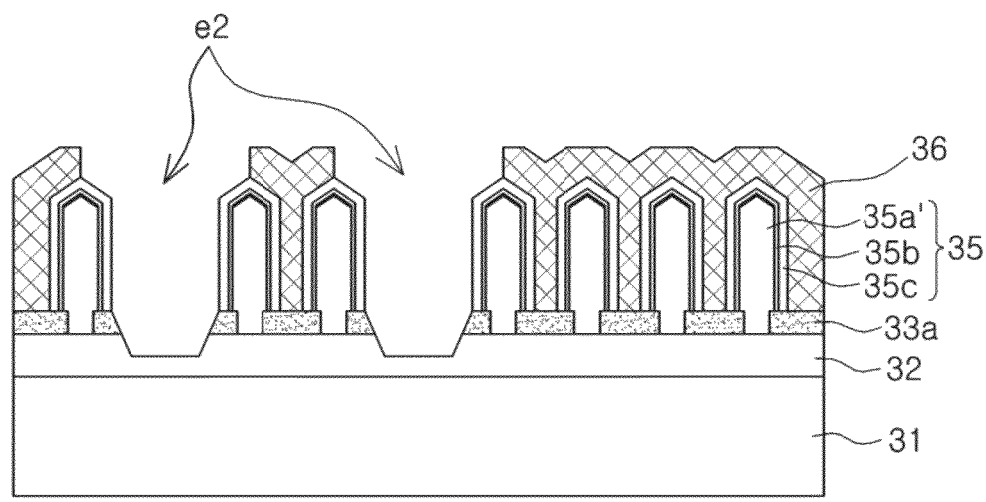

Thereafter, as illustrated in FIG. 7B, exposed regions e1 in which the nano-light emitting structures 35 are exposed are formed in regions in which an electrode having one polarity is to be formed, and as illustrated in FIG. 7C, the exposed nano-light emitting structures 36 are selectively removed to form base exposed regions e2 in which portions of the base layer 32 are exposed. The process illustrated in FIG. 7B is an etching process with respect to an electrode material such as metal, and the process illustrated in FIG. 7C is an etching process with respect to a semiconductor material. Both processes may be performed under different conditions.

Figure 7D:
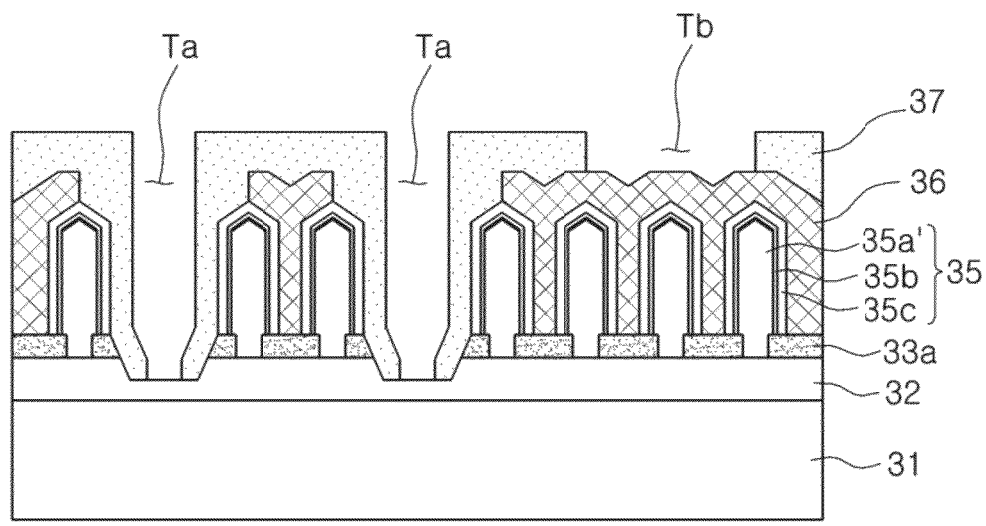

Subsequently, as illustrated in FIG. 7D, an insulating layer 37 is formed such that contact regions Ta and Tb of an electrode are exposed. The contact regions T1 of a first electrode may be provided as at least partial regions of the exposed regions e2 of the base layer 32, and the contact region Tb of a second electrode may be provided as a region in which a portion of the contact electrode 36 is exposed.

Figure 7E:
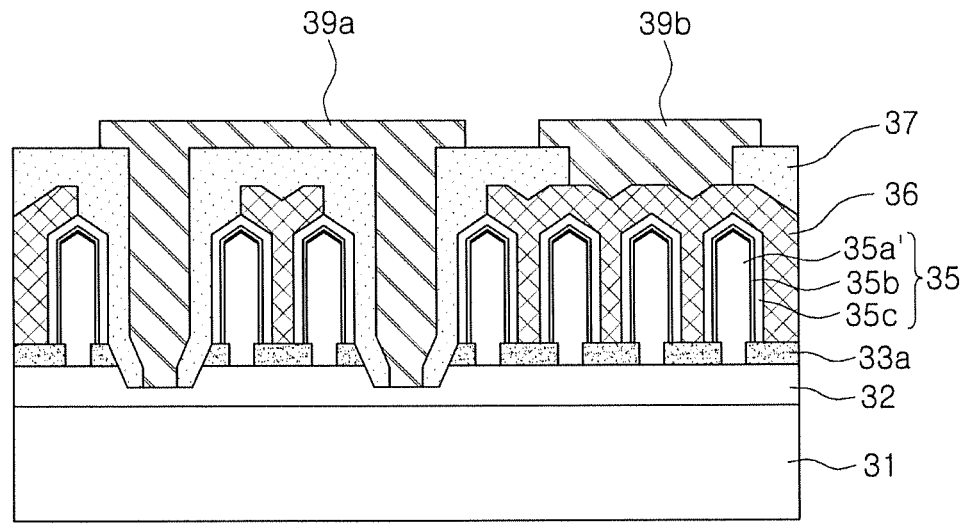

Thereafter, as illustrated in FIG. 7E, first and second electrodes 39a and 39b are formed to be connected to the contact regions Ta and Tb of the first and second electrodes, respectively. As an electrode material used in this process, a common electrode material of the first and second electrodes 39a and 39b may be used. For example, a material for the first and second electrodes 39a and 39b may be Au, Ag, Al, Ti, W, Cu, Sn, Ni, Pt, Cr, NiSn, TiW, AuSn, or a eutectic metal thereof.

FIGS. 8A through 8D are cross-sectional views illustrating major processes of forming nano-light emitting structures using the mask 43 illustrated in FIG. 5A.

Figure 8A:
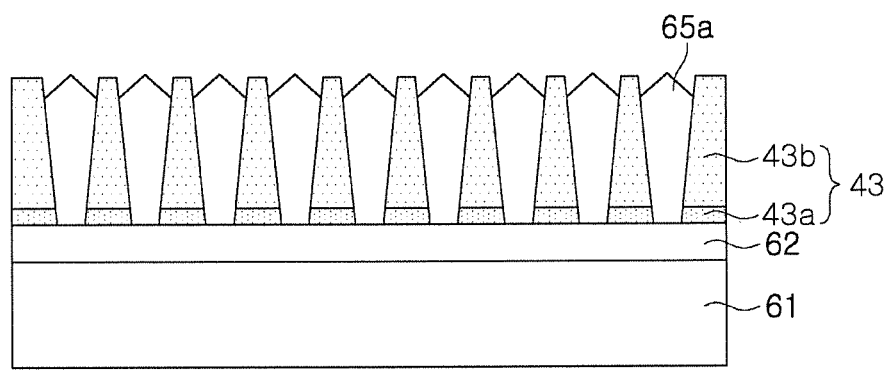
FIGS. 8A through 8D are cross-sectional views illustrating processes for obtaining nanocores using the mask illustrated in FIG. 4A.

As illustrated in FIG. 8A, nanocores 64a may be grown on a base layer 62 using the mask 43. The mask 43 has openings having a width decreased toward a lower portion thereof. The nanocores 65a may be grown to have a shape corresponding to that of the openings.

In order to further enhance crystal quality of the nanocores 65a, a heat treatment process may be performed one or more times during the growth of the nanocores 65a. In particular, a surface of a tip portion of each nanocore 65a may be rearranged to have a hexagonal pyramidal crystal face, thus obtaining a stable crystal structure and guaranteeing high quality of a crystal grown in a follow-up process.

The heat treatment process may be performed under the temperature condition as described above. For example, for process convenience, the heat treatment process may be performed at a temperature equal or similar to the growth temperature of the nanocores 65a. Also, the heat treatment process may be performed in a manner of stopping a metal source such as TMGa, while maintaining pressure and a temperature equal or similar to the growth pressure and temperature of the nanocores 65a. The heat treatment process may be continued for a few seconds to tens of minutes (for example, 5 seconds to 30 minutes), but a sufficient effect may be obtained even with a time duration ranging from approximately 10 seconds to 60 seconds.

The heat treatment process introduced during the growth process of the nanocores 65a may prevent degeneration of crystallinity caused when the nanocores 65a are grown at a fast speed, and thus, fast crystal growth and excellent crystal quality may be promoted.

A time of a heat treatment process section and the number of heat treatment processes for stabilization may be variously modified according to a height and diameter of final nanocores. For example, in a case in which a width of each opening ranges from 300 nm to 400 nm and a height of each opening (thickness of the mask) is approximately 2.0 μm, a stabilization time duration ranging from approximately 10 seconds to 60 seconds may be inserted in a middle point, i.e., approximately 1.0 μm to grow cores having desired high quality. The stabilization process may be omitted according to core growth conditions.

Figure 8B:
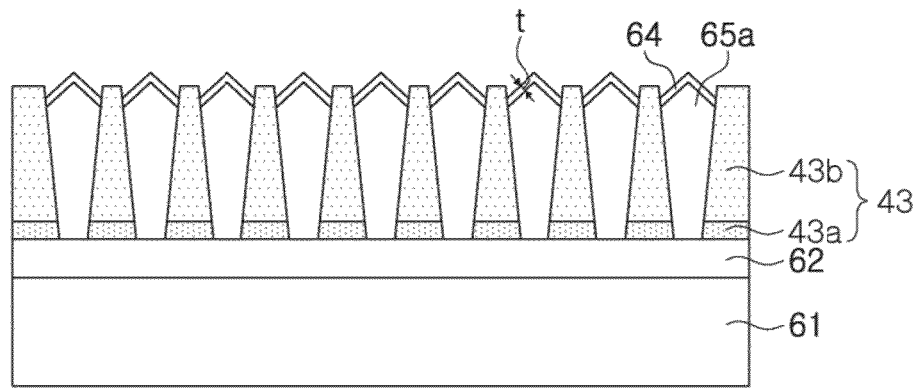

Subsequently, as illustrated in FIG. 8B, a current blocking intermediate layer 64 may be formed on tip portions of the nanocores 65a.

After the nanocores 65a are formed to have a desired height, the current blocking intermediate layer 64 may be formed on the surfaces of the tip portions of the nanocores 65a with the mask 63 retained as is. Thus, since the mask 43 is used as is, the current blocking intermediate layer 64 may be easily formed in the desired regions (the surface of the tip portions) of the nanocores 65a without forming an additional mask.

The current blocking intermediate layer 64 may be a semiconductor layer not doped on purpose or may be a semiconductor layer doped with a second conductivity-type impurity opposite to that of the nanocores 65a. For example, in a case in which the nanocores 65a are n-type GaN, the current blocking intermediate layer 64 may be undoped GaN or GaN doped with magnesium (Mg) as a p-type impurity. In this case, by changing types of an impurity during the same growth process, the nanocores 65a and the current blocking intermediate layer 64 may be continuously formed. For example, in case of stopping silicon (Si) doping and injecting magnesium (Mg) and growing the same for approximately 1 minute under the same conditions as those of the growth of the n-type GaN nanocores, the current blocking intermediate layer 64 having a thickness ranging from approximately 200 nm to 300 nm may be formed, and such a current blocking intermediate layer 64 may effectively block a leakage current of a few μA or more. In this manner, the current blocking intermediate layer may be simply formed during the mold-type process as in the present exemplary embodiment.

Figure 8C:
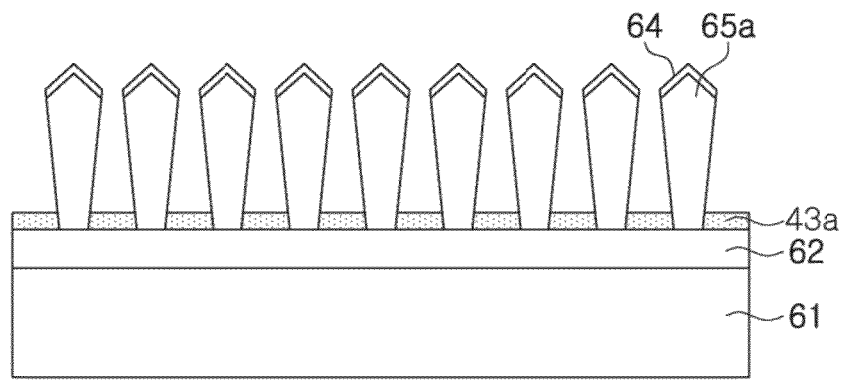

Subsequently, as illustrated in FIG. 8C, portions of the mask layer 43 to reach the first material layer 43a as an etch-stop layer are removed to expose lateral surfaces of the plurality of nanocores 65a.

In the present exemplary embodiment, by applying the etching process of selectively removing the second material layer 43b, only the second material layer 43b may be removed, while the first material layer 43a may remain. The residual first material layer 43a may serve to prevent the active layer and the second conductivity-type semiconductor layer from being connected to the base layer 62 in a follow-up growth process.

In the present exemplary embodiment, an additional heat treatment process may be introduced during the process of forming the nano-light emitting structures using the mask having openings as a mold in order to enhance crystallinity.

Figure 8D:
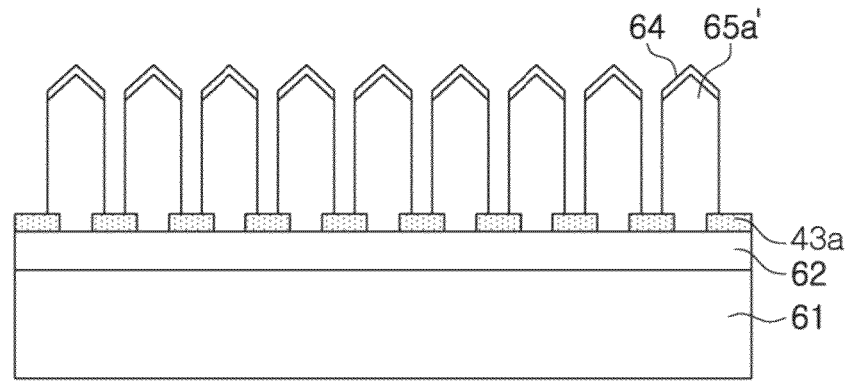

After the second material layer 43b of the mask 43 is removed, the surfaces of the nanocores 65a may be heat-treated under predetermined conditions to change unstable crystal faces of the nanocores 65a into stable crystal faces (please refer to FIGS. 6A and 6B). In particular, in the present exemplary embodiment, the nanocores 65a are grown on the openings having sloped side walls to have the sloped side walls corresponding to the shape of the openings, but as illustrated in FIG. 8D, after the heat treatment process is performed, crystals are rearranged and regrown so the nanocores 65a' may have a substantially uniform diameter (or width). Also, the tip portions of the nanocores 65a immediately after being grown may have an incomplete hexagonal pyramidal shape, but the nanocores 65a' after the heat treatment process may have a hexagonal pyramidal shape having uniform surfaces. In this manner, the nanocores having a non-uniform width after the removal of the mask may be regrown (and rearranged) to have a hexagonal pyramidal columnar structure having a uniform width through the heat treatment process.

Hereinafter, the results of the regrowth (rearrangement) of the nanocores based on the heat treatment process as described above will be described through specific Experimental Example.

Experimental Example

Heat Treatment Process

Two layers of SiN/SiO$_2$ were formed on an n-type GaN base layer and openings were formed. Here, the SiN layer ("a" in FIG. 9) was formed to have a thickness of approximately 100 nm and the SiO$_2$ layer ("b" in FIG. 9) was formed to have a thickness of 2500 nm. Openings of the mask were formed by performing etching with a plasma obtained by combining $C_4F_8$, $O_2$ and, Ar for approximately 5 minutes through a photoresist (layer positioned on "b" in FIG. 9) process. FIG. 9 is a scanning electron microscope (SEM) photograph obtained by imaging a cross-section of a opening obtained through the process. As illustrated in FIG. 9, the opening of the mask has a width decreased toward a lower portion thereof.

Nanocores were grown on the openings of the mask using an MOCVD process. Here, TMGa and NH$_3$ were used as source gases, and nanocores were grown for approximately minutes, while maintaining the temperature of a substrate at approximately 1100° C.

In order to enhance crystal quality of the nanocores, a stabilization process (heat treatment process) was additionally performed during the growth of the nanocores. Namely, when the nanocores 35a were grown to reach a height of approximately 1.0 μm, a desired intermediate point (approximately 10 minutes) of the nanocores, supply of a TMGa source was stopped and a heat treatment was performed at a temperature (approximately 1100° C.) similar to that of the substrate during the growth for approximately 30 seconds to 50 seconds under an NH$_3$ atmosphere.

Figure 10A:
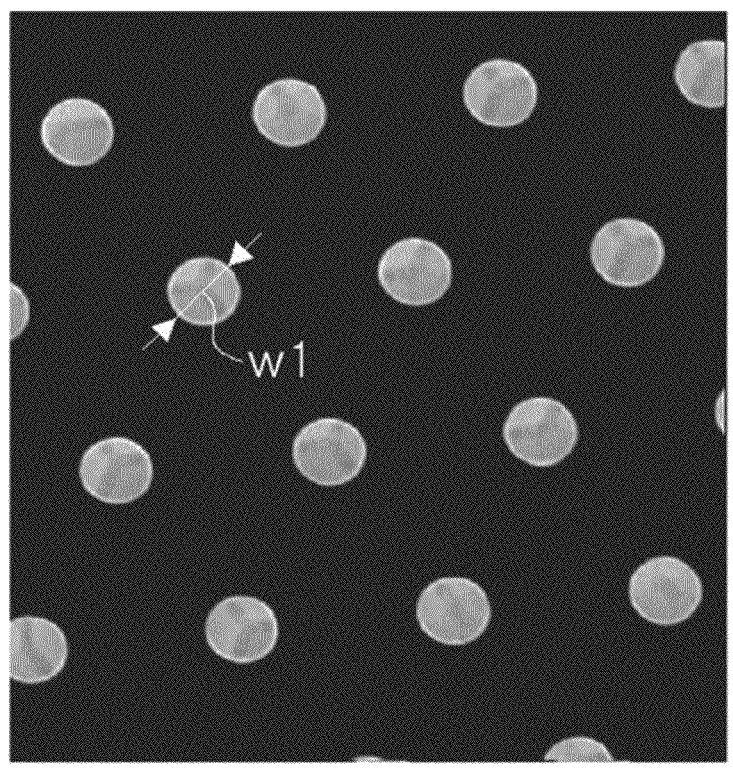
FIGS. 10A and 10B are SEM photographs obtained by imaging a planar arrangement of nanocores and a cross-sectional structure grown using a mask employed in an Experimental example.
Figure 10B:
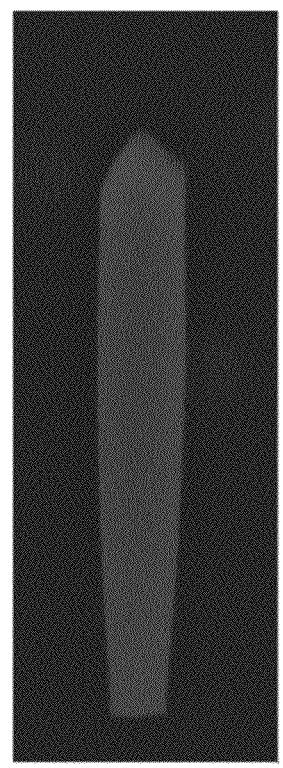

After the growth of the desired nanocores was completed, the SiO$_2$ layer ("b" in FIG. 9) of the mask was removed. The nanocores corresponding to the shape of the openings appeared to have a cylindrical shape having sloped side walls (please refer to FIGS. 10A and 10B). The nanocores having the cylindrical structure were checked to have a height of approximately 2467 nm and a diameter of approximately 350 nm.

After the mask was removed, a heat treatment process was applied. Namely, the heat treatment process was performed at a substrate temperature of approximately 1100° C. (1000° C. to 1200° C.) for approximately 20 minutes (15 minutes to 25 minutes).

Figure 11A:
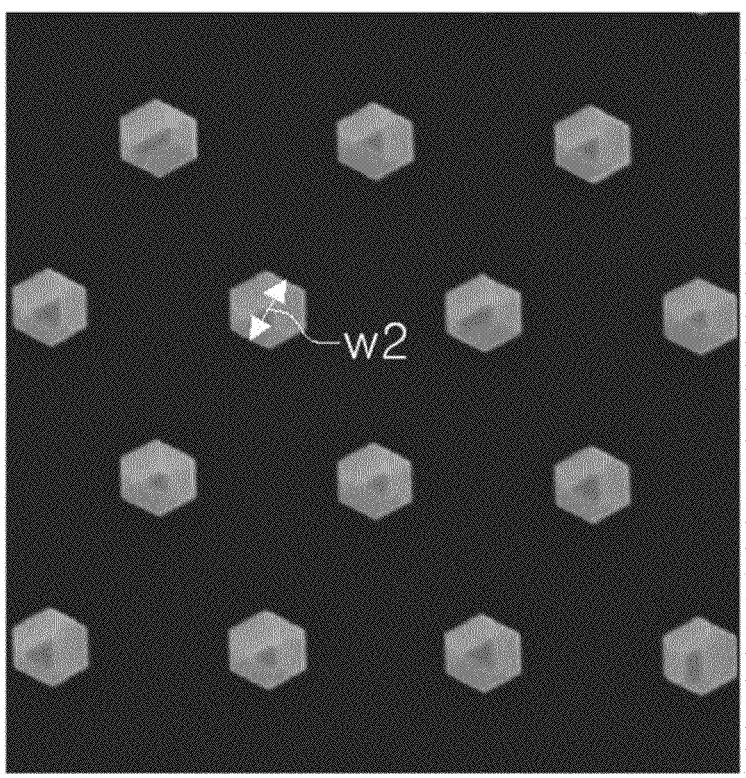
FIGS. 11A and 11B are SEM photographs obtained by imaging a planar arrangement of nanocores and a cross-sectional structure heat-treated in an Experimental example.
Figure 11B:
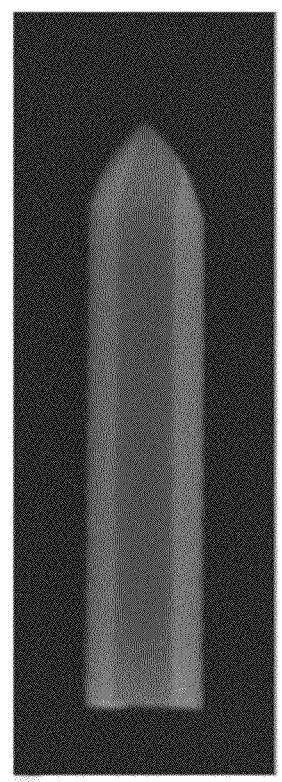

After the heat treatment process, crystals of the nanocores were regrown and rearranged, and it was confirmed that the diameter which was not uniform in the height direction was changed into a substantially uniform diameter and the incomplete hexagonal pyramidal shape of the tip portions of the nanocores was changed into a hexagonal pyramidal shape having uniform surfaces after the heat treatment process (please refer to FIGS. 11A and 11B).

In detail, a diameter w1 of each nanocore before the heat treatment process was 350 nm, but after the heat treatment process, the width (w2: interfacial interval of the hexagon) was approximately 410 nm, approximately 60 nm or greater. Also, it was confirmed that, while a degree of increase is smaller, a height of each nanocore was changed from 2467 nm to 2470 nm, showing an increase of approximately 3 nm.

As in the Experimental Example, it was confirmed that the nanocores having an uneven width after the removal of the mask was regrown (and rearranged) to have the hexagonal pyramidal columnar structure having a uniform width through the heat treatment process.

During the foregoing heat treatment process, a size and a shape of the nanocores after the regrowth may be relatively changed depending on a heat treatment process temperature (namely, a substrate temperature) and a heat treatment process time, whether or not a source gas is supplied, or an amount of supplied source gas. For example, heat treatment is performed at a temperature of 1000° C. or higher for 5 or more minutes in a state in which supply of a source gas is stopped, crystals are rearranged on the surface of the nanocores, reducing a change in size of nanocores due to an etching effect (namely, N evaporation). The change in the diameter of the nanocores may be maintained at a level of 10% or less in consideration of a process time, condition, and cost. As described above, uniformity of the diameter (or width) of the nanocores may be maintained at 95% or more. In this case, the diameter of each nanocore grown in a group in which sizes of openings of the mask are equal may be substantially equal.

Through the foregoing exemplary embodiment, the example of method of manufacturing a nano-structure semiconductor light emitting device to grow nanocores using a mask including openings as a mold structure has been described, but the exemplary embodiment may be modified or improved to various specific examples.

At least a portion of the plurality of nanocores may be designed such that at least one of a cross-section (or a diameter) thereof and an interval therebetween is different from that of other nanocores.

Figure 12:
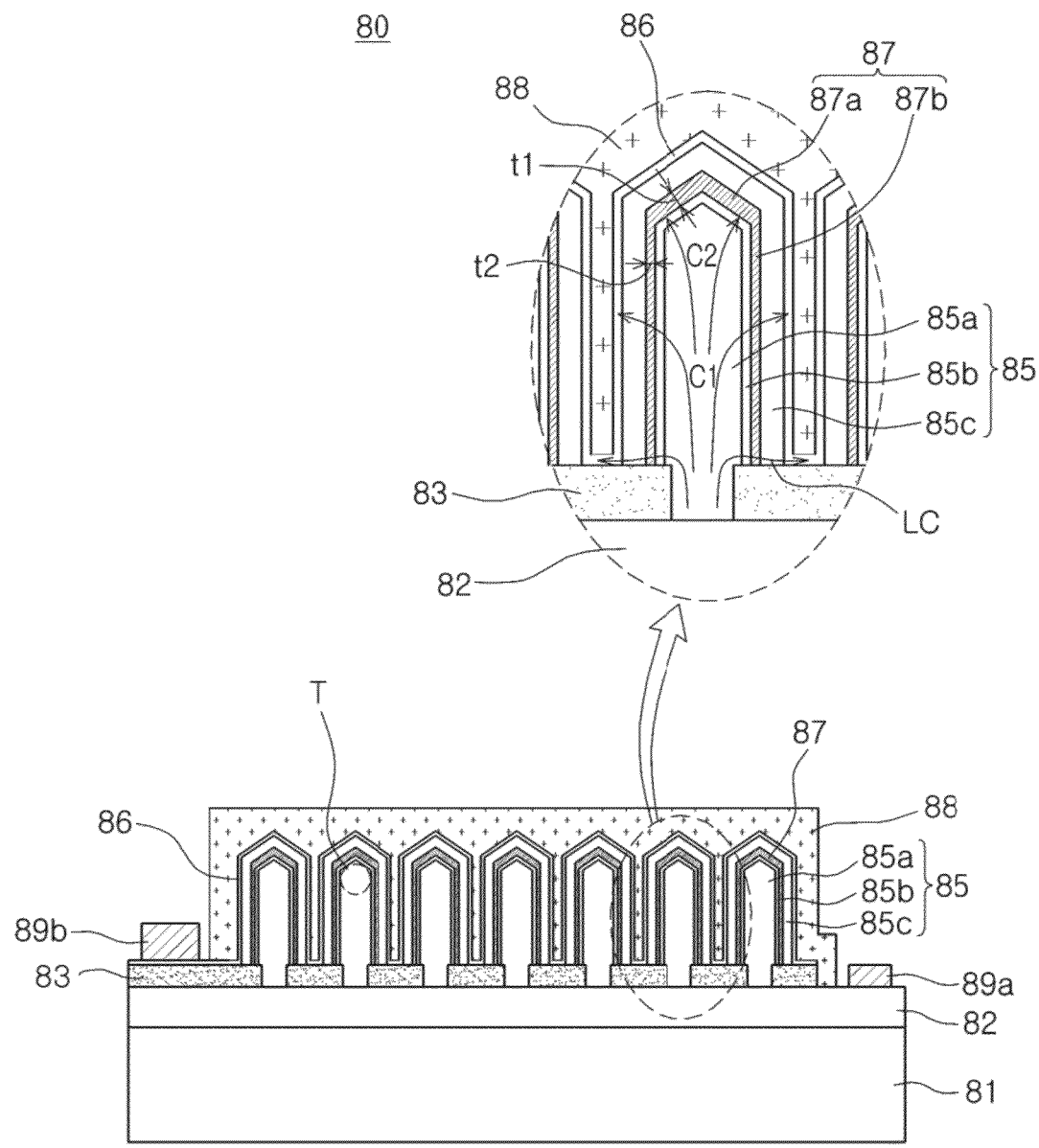
FIG. 12 is a cross-sectional view illustrating a nano-structure semiconductor light emitting device according to an exemplary embodiment of the present disclosure.

In the foregoing exemplary embodiment, the n-side current blocking intermediate layer positioned on the tip portions of the nanocores below the active layer has been described, but such a current blocking intermediate layer may also be implemented as a p-side current blocking intermediate layer formed on the active layer region corresponding to the tip portions of the nanocores below the second conductivity-type semiconductor layer. FIG. 12 is a cross-sectional view illustrating a nano-structure semiconductor light emitting device employing a p-side current blocking intermediate layer according to another exemplary embodiment of the present disclosure.

A nano-structure semiconductor light emitting device 80 illustrated in FIG. 12 includes a base layer 82 formed of a first conductivity-type semiconductor material and a plurality of nano-light emitting structures 85 formed on the base layer 82.

Each nano-light emitting structure 85 includes a nanocore 85*a* formed of a first conductivity-type semiconductor, and an active layer 85*b* and a second conductivity-type semiconductor layer 85*c* sequentially formed on a surface of the nanocore 85.

The nano-structure semiconductor light emitting device 80 may include a contact electrode 86 connected to the second conductivity-type semiconductor layer 85*c*. An insulating protective layer 88 may be formed on the nano-light emitting structure 85. The nano-structure semiconductor light emitting device 80 may include first and second electrodes 89*a* and 89*b*. The first electrode 89*a* may be disposed in a partially exposed region of the base layer 82 formed of the first conductivity-type semiconductor. Also, the second electrode 89*b* may be disposed in an exposed portion of an extended region of the contact electrode 86.

The present exemplary embodiment may be similar to the exemplary embodiment illustrated in FIG. 1, and description of respective corresponding elements described with reference to FIG. 1 may be combined with descriptions of the present exemplary embodiment, unless otherwise mentioned.

As illustrated in FIG. 12, the nanocore 85 has a tip portion T having a different crystal face from those of other regions.

Unlike the current blocking intermediate layer 14 illustrated in FIG. 1, the current blocking intermediate layer 87 employed in the present exemplary embodiment is formed in a region 87*a* corresponding to the tip portion T of the nanocore 85*a* so as to be positioned between the active layer 85*b* and the second conductivity-type semiconductor layer 85*c* and extends from the region 87*a* to a region 87*b* corresponding to a lateral surface of the nanocore 85*a*.

The current blocking intermediate layer 87 may be an undoped semiconductor layer or a semiconductor layer doped with a first conductivity-type impurity. The current blocking intermediate layer 87 may be undoped GaN or GaN doped with an n-type impurity such as silicon (Si).

In particular, as illustrated in FIG. 12, the current blocking intermediate layer 87 may be formed on the entire surface of the nano-structure such that portions positioned on the lateral surface and on the tip portion of the nanocore 85*a* may have different thicknesses. Namely, in the current blocking intermediate layer 87, a thickness t2 of the portion 87*b* positioned in the region corresponding to the lateral surface of the nanocore 85*a* may be smaller than a thickness t1 of the portion 87*a* positioned in the region corresponding to the tip portion of the nanocore 85*a*. The thickness variations may be easily implemented by setting growth conditions of the semiconductor single crystal such that growth in a vertical direction is dominant. The thickness variations may be controlled by appropriately adjusting growth process factors (for example, pressure, a flow amount of source, temperature, and the like).

In the present exemplary embodiment, the current blocking intermediate layer 87 has the sufficient thickness t1 in the tip portion T of the nanocore 85*a*, a leakage current LC may be effectively prevented, and since the current blocking intermediate layer 87 has a relatively small thickness t2 on the lateral surface of the nanocore 85*a*, desired electrical conduction for driving the light emitting device may be guaranteed.

In order to effectively secure the selective blocking and electrical conduction, preferably, the current blocking intermediate layer 87 is formed to have sufficient thickness variations. In the current blocking intermediate layer 87, the thickness t1 of the portion 87*a* corresponding to the tip portion of the nanocore 85*a* is approximately 50 nm or greater, and the thickness t2 of the portion 87*b* positioned in the region corresponding to the lateral surface of the nanocore 85*a* may be approximately 20 nm or smaller.

Accordingly, a current flow C1 to the active layer region formed on the lateral surface of the nanocore 85*a* is normally guaranteed, while a current flow C2 to the active layer region formed in the tip portion of the nanocore 85*a* may be interrupted by the current blocking intermediate layer 87.

The resistance adjustment may also be implemented with impurity concentration, but in a case in which two regions are grown through the same process, it may rather be easy to adjust the thicknesses of respective regions to form a desired selective high resistance structure.

In the case of adjusting thicknesses of two portions of the current blocking intermediate layer 87, the portion 87*b* positioned in the region corresponding to the lateral surface of the nanocore 85*a* and the portion 87*a* positioned in the region corresponding to the tip portion of the nanocore 85*a* may have the substantially same impurity concentration. The first conductivity-type impurity of the current blocking intermediate layer 87 may be doped with concentration such that the current blocking intermediate layer 87 may have appropriate resistance at approximately $1.0 \times 10^{16}$/cm$^3$ or higher.

In the present exemplary embodiment, the current blocking intermediate layer 87 may extend to be contiguous with a surface of the insulating layer 83. The portion 87b positioned in the region corresponding to the lateral surface of the nanocore 85a may extend to the insulating layer 83 to effectively block a leakage current LC generated in a space between the insulating layer 83 and the semiconductor layer (in particular, the active layer 85b). Here, the generated leakage current LC is small, relative to that in the tip portion T, and thus, an additional leakage current suppression effect can be obtained even in the case that the thickness t2 is small. In order to obtain such a leakage current suppression effect, the thickness t2 of the portion 87b positioned in the region corresponding to the lateral surface of the nanocore 85a may be approximately 5 nm or greater.

Hereinafter, the method of manufacturing a nano-structure semiconductor light emitting device according to the present exemplary embodiment will be described with reference to FIGS. 13A through 13C and FIGS. 14A through 14E.

Figure 13A:
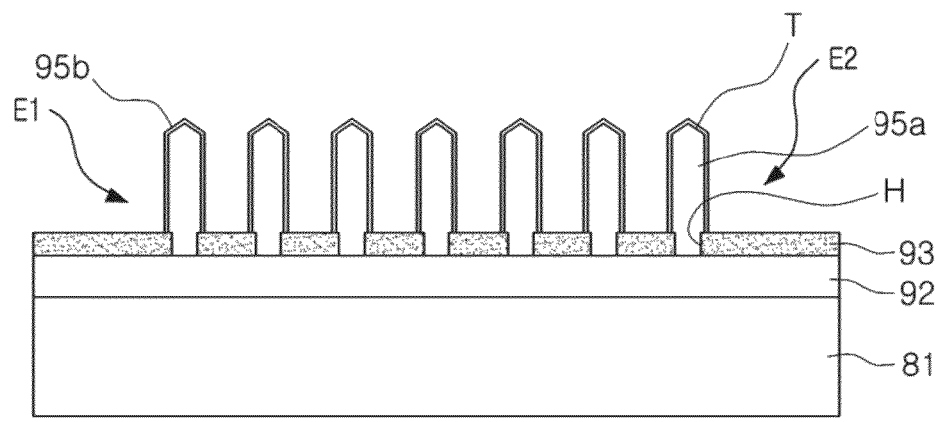
FIGS. 13A through 13C are cross-sectional views illustrating major processes of another example of a method of manufacturing a nano-structure semiconductor light emitting device according to an exemplary embodiment of the present disclosure.
Figure 13B:
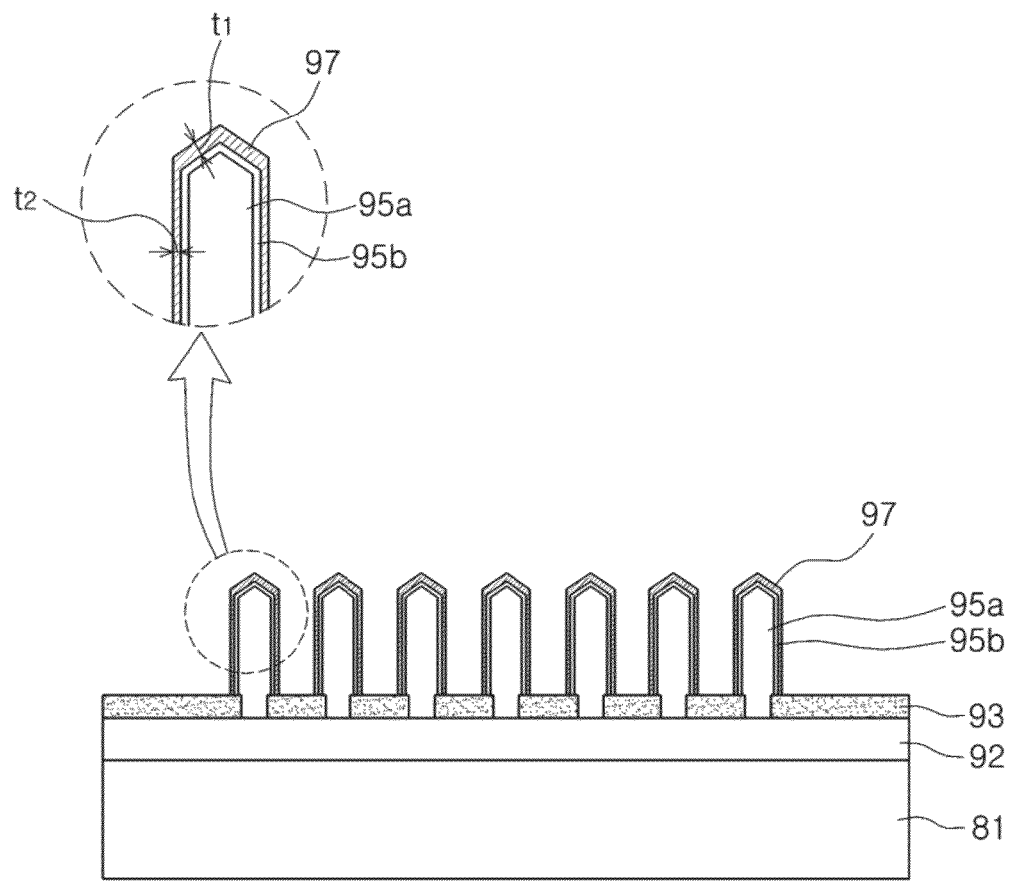
Figure 13C:
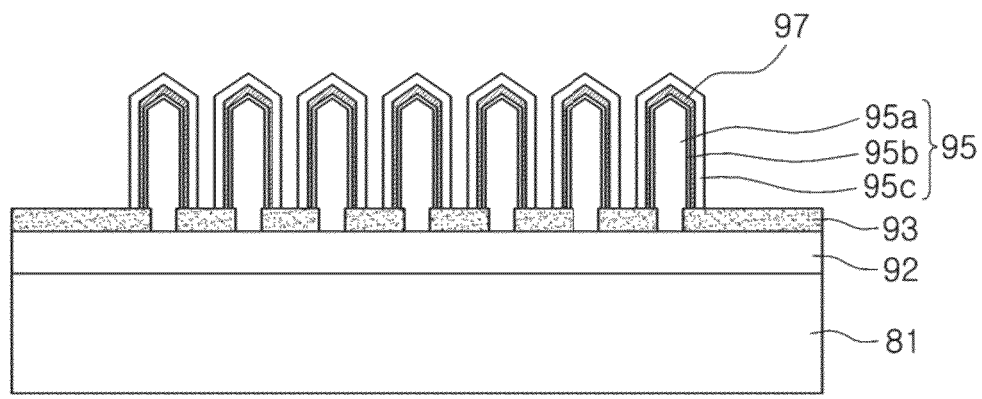

FIGS. 13A through 13C are cross-sectional views illustrating major processes of forming a nano-light emitting structure in the method of manufacturing a nano-structure semiconductor light emitting device according to the present exemplary embodiment.

As illustrated in FIG. 13A, an insulating layer 93 is formed as a mask on a base layer 92 formed of a first conductivity-type semiconductor, a plurality of nanocores 95a are formed on exposed regions of the base layer 92, and an active layer 95b is formed on surfaces of the plurality of nanocores 95a (the heat treatment process described above with reference to FIGS. 6A and 6B may also be applied to this process, and detailed descriptions thereof are omitted).

The mask 93 may have openings H for growing the nanocores 95. Such an opening H may not be formed n regions E1 and E2 in which electrodes are to be formed, in order not to grow the nanocores 95a therein. As described above, a tip portion T of each nanocores 95a has a crystal face (for example, r face) different from a crystal face (for example, m face) of a lateral surface thereof, making the active layer 95b have compositions different according to the crystal faces and have a relatively small thickness, resulting in a change in emitted light wavelength characteristics and generation of a leakage current.

Subsequently, as illustrated in FIG. 13B, a current blocking intermediate layer 97 is formed on a surface of the active layer 95b. The current blocking intermediate layer 97 may be formed to extend from a region corresponding to the tip portion T of the nanocore 95a to a region corresponding to the lateral surface of the nanocore 95a.

In this manner, the current blocking intermediate layer 97 is formed on the entire surfaces of the nano-structure, but a thickness t2 of the portion positioned in the region corresponding to the lateral surface of the nanocore 95a may be smaller than a thickness t1 of the portion positioned in the region corresponding to the tip portion of the nanocore 95a.

The current blocking intermediate layer 97 may be an undoped semiconductor layer or a semiconductor layer doped with a first conductivity-type impurity. The current blocking intermediate layer 97 may be undoped GaN or GaN doped with an n-type impurity such as silicon (Si).

Thereafter, as illustrated in FIG. 13C, a second conductivity-type semiconductor layer 95c is formed on the current blocking intermediate layer 97. Accordingly, the current blocking intermediate layer 97 may be positioned between the active layer 95b and the second conductivity-type semiconductor layer 95c. Through this structure, a current flow to the active layer 95b region formed on the lateral surface of the nanocore 95a may be normally guaranteed, while a current flow to the active layer 95b region formed in the tip portion of the nanocore 95a.

In the nano-structure semiconductor light emitting device illustrated in FIG. 13C, electrodes may be formed to have various arrangements. FIG. 14A through 14E are cross-sectional views illustrating major processes to form electrodes.

Figure 14A:
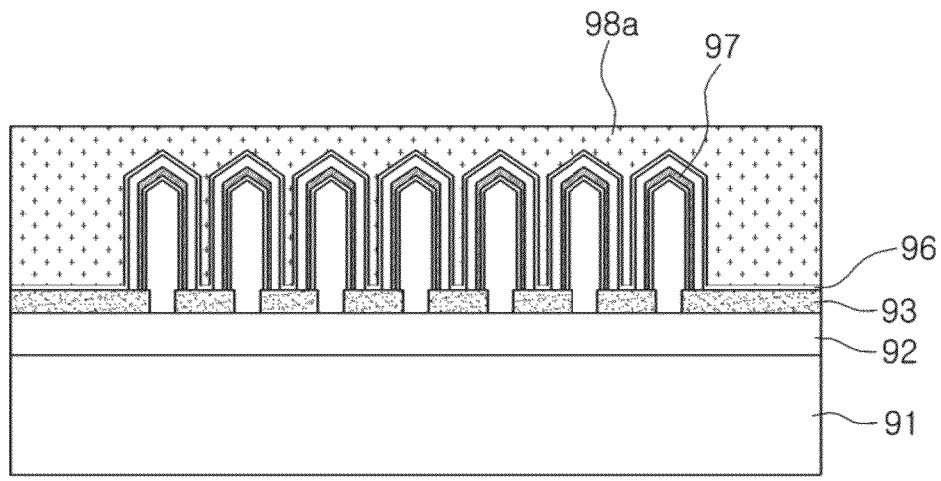
FIGS. 14A through 14E are cross-sectional views illustrating major processes of an example of forming an electrode with respect to the product illustrated in FIG. 13C.

As illustrated in FIG. 14A, a contact electrode 96 is formed on the nano-light emitting structures 95, and a first passivation layer 98a is subsequently formed. Such a first passivation layer 95a may be formed of various insulating protective layer materials as mentioned above in the former exemplary embodiment.

Figure 14B:
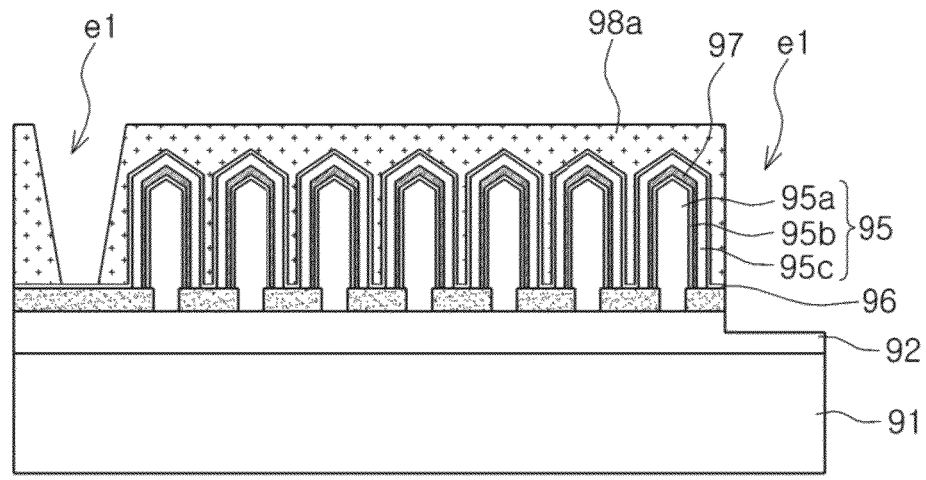

Subsequently, as illustrated in FIG. 14B, the first passivation layer 95a is selectively removed to expose partial regions of the base layer 92 and the contact electrode 96 to provide electrode formation regions (e1). In addition, the exposed regions e1 may be provided as regions in which a first electrode is to be formed. This process may be implemented using a general photolithography process.

Figure 14C:
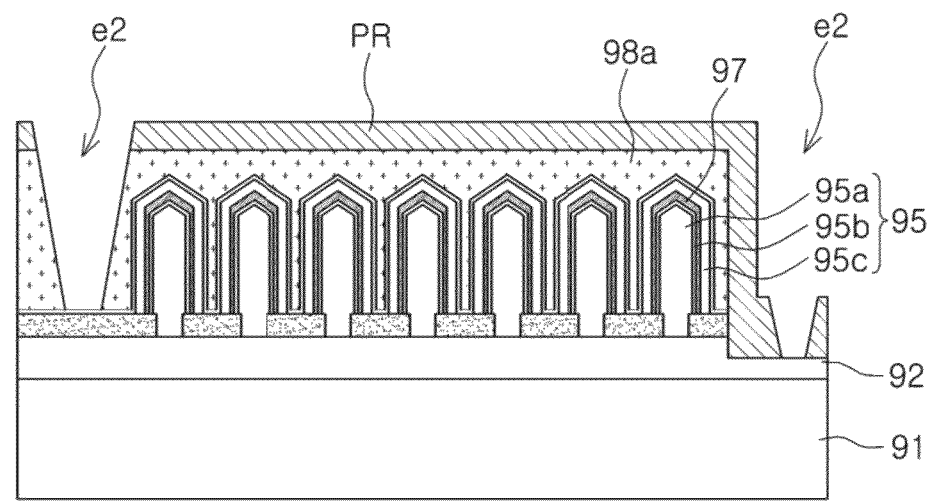
Figure 14D:
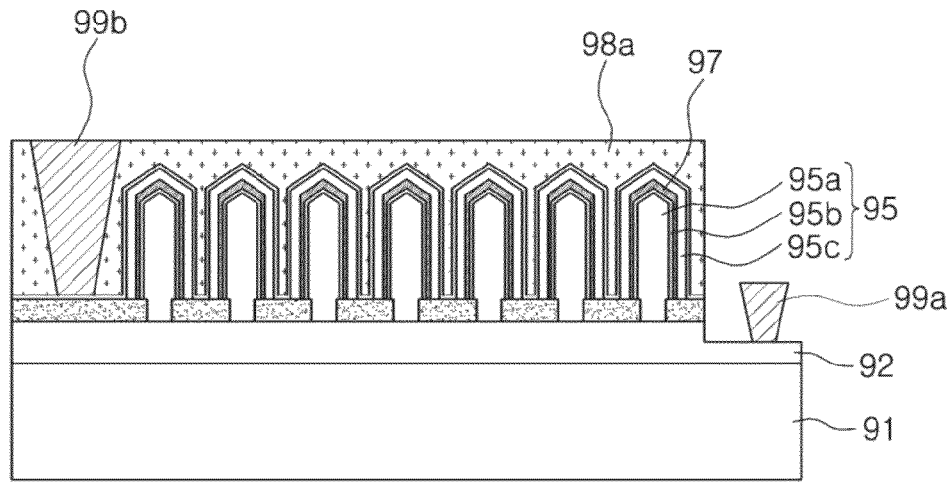

Thereafter, as illustrated in FIG. 14C, photoresist PR may be formed to define contact regions e2 of first and second electrodes. Subsequently, as illustrated in FIG. 14D, first and second electrodes 99a and 99b may be formed in the contact regions of first and second electrodes. As an electrode material used in this process, a common electrode material of the first and second electrodes 99a and 99b may be used. For example, a material for the first and second electrodes 39a and 39b may be Au, Ag, Al, Ti, W, Cu, Sn, Ni, Pt, Cr, NiSn, TiW, AuSn, or a eutectic metal thereof.

Figure 14E:
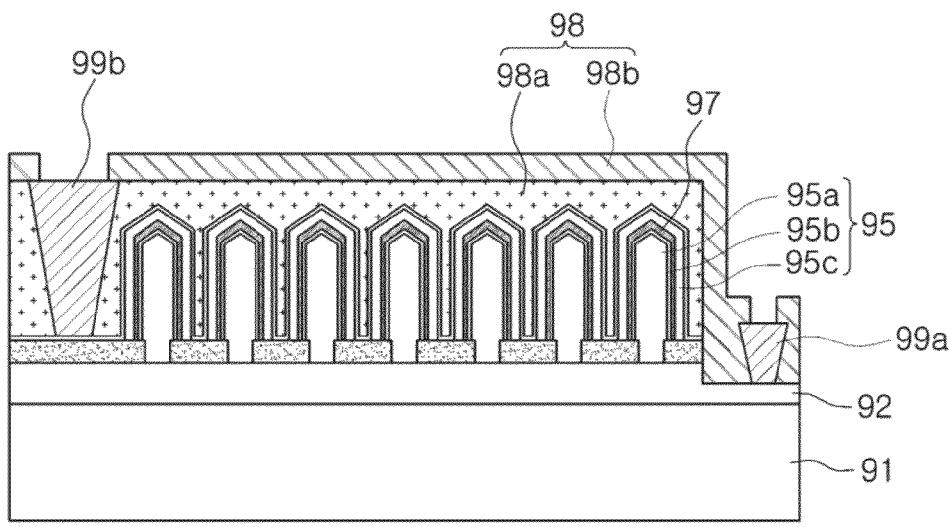

Subsequently, as illustrated in FIG. 14E, an additional second passivation layer 98b may be formed as needed. The second passivation layer 98b may provide a protective layer 98 together with the first passivation layer 98a. The second passivation layer 98b may cover the exposed semiconductor region to protect the same, and firmly support the first and second electrodes 99a and 99b as well.

The second passivation layer 98b may be formed of a material identical to that of the first passivation layer 98a.

FIGS. 15A through 15D are cross-sectional views illustrating major processes of an example of forming an electrode with respect to the product illustrated in FIG. 13C.

Figure 15A:
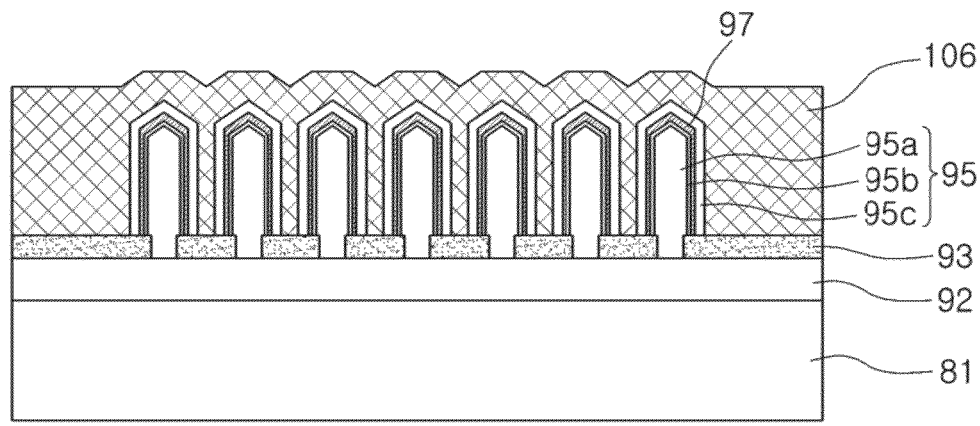
FIGS. 15A through 15D are cross-sectional views illustrating major processes of an example of forming an electrode with respect to the product illustrated in FIG. 13C.

First, as illustrated in FIG. 15A, a contact electrode 106 is formed on the nano-light emitting structure 95 obtained in FIG. 13C. The contact electrode 106 may be similar to that described above with reference to FIG. 7A.

The contact electrode 106 may include an appropriate material capable of realizing ohmic-contact with the second conductivity-type semiconductor layer 95c on a surface of the nano-light emitting structure 95. The material for ohmic-contact may include at least one of materials among ITO, ZnO, a graphic layer, Ag, Ni, Al, Rh, Pd, Ir, Ru, Mg, Zn, Pt, Au, and the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, and the like. Preferably, the ohmic-contact material used to form the contact electrode 106 may be a reflective metal layer in consideration of light extraction efficiency. In a specific example, the contact electrode 106 illustrated in FIG. 15A may be formed by applying an electroplating process to the material for ohmic-contact as a seed layer. For example, after Ag/Ni/Cr are formed as seed layers, Cu/Ni may be electroplated to form the desired contact electrode 106.

Figure 15B:
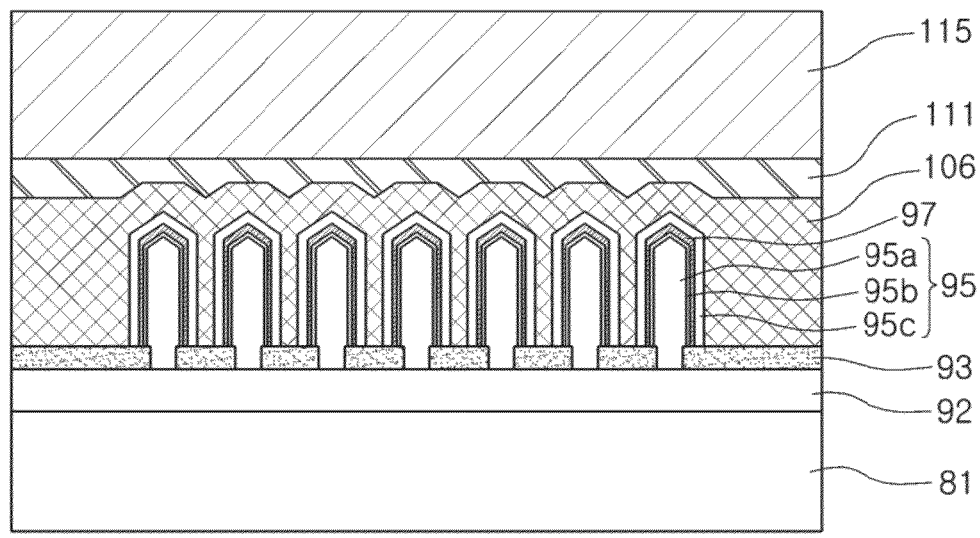

Subsequently, as illustrated in FIG. 15B, a permanent substrate 115 may be bonded to the contact electrode 106.

The permanent substrate 115 may be an insulating or conductive substrate. For example, the permanent substrate 115 may be a silicon (Si) substrate or an Si—Al alloy substrate. The permanent substrate 115 may be bonded to the contact electrode 106 using a bonding metal layer 111. The bonding metal layer 111 may be formed of a metal selected from the group consisting of Ni, Pt, Au, Cu, Co, Sn, In, Zn, Bi, Au, and combinations thereof, or alloys thereof. For example, the bonding metal layer 111 may be a eutectic metal layer such as Ni/Sn.

Figure 15C:
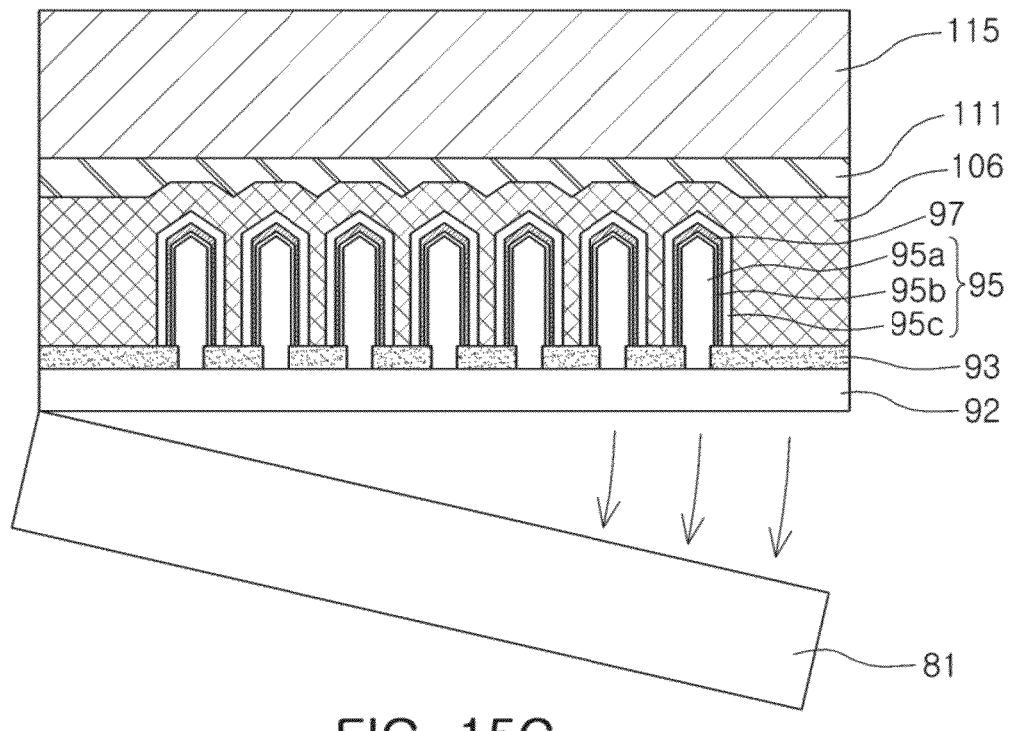

Thereafter, as illustrated in FIG. 15C, a substrate 81 used to grow crystals may be removed from the first conductivity-type semiconductor base layer 92.

This process may be performed using a laser lift-off (LLO) process or a grinding/etching process. For example, in a case in which the substrate 81 is a sapphire substrate, the growth substrate 81 may be separated from the first conductivity-type semiconductor base layer 92 by irradiating a laser beam to an interface between the substrate 81 and the first conductivity-type semiconductor base layer 92. Meanwhile, in a case in which the substrate is an opaque substrate such as silicon (Si), the substrate 81 may be removed using a grinding/etching process.

Figure 15D:
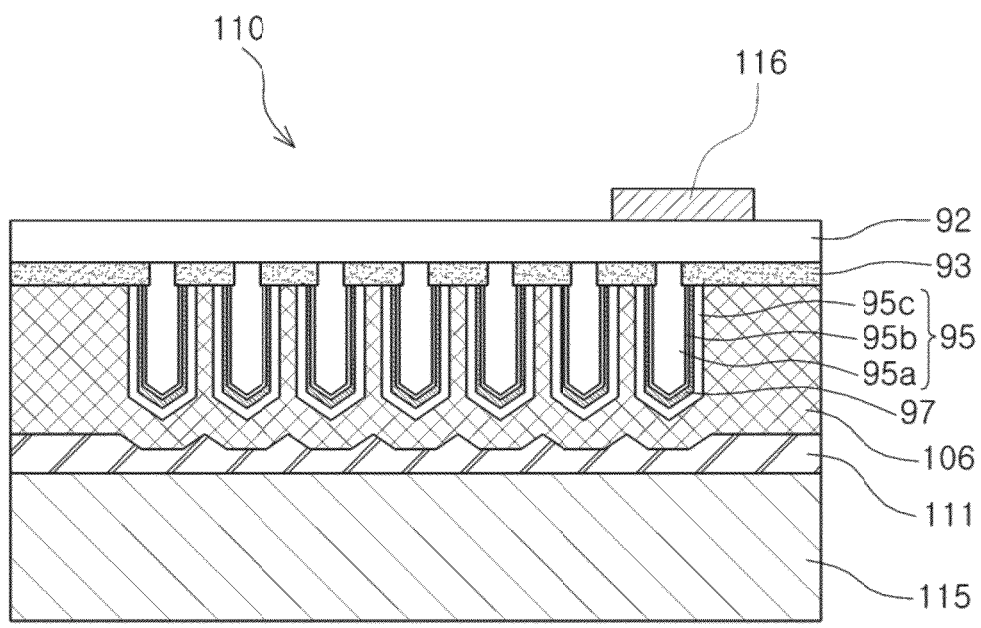

Subsequently, as illustrated in FIG. 15D, an electrode pad 116 is formed on a surface of the first conductivity-type semiconductor base layer 92 from which the growth substrate 81 was removed, to obtain a desired nano-structure semiconductor light emitting device 110. The permanent substrate 115, a conductive substrate, may be used as an electrode connected to an external circuit.

Figure 16:
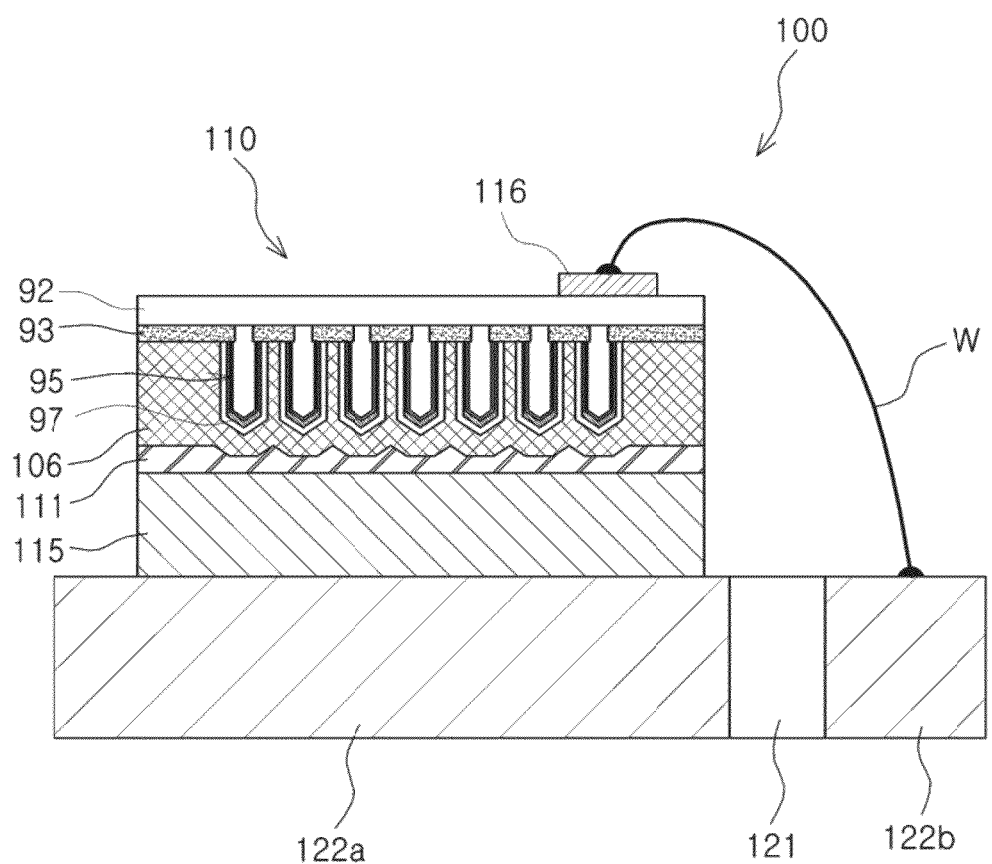
FIG. 16 is a cross-sectional view illustrating a package having a nano-structure semiconductor light emitting device illustrated in FIG. 15D.

FIG. 16 is a cross-sectional view illustrating a light emitting device package having the nano-structure semiconductor light emitting device illustrated in FIG. 15D.

A light emitting device package 100 illustrated in FIG. 16 includes a package substrate 121 having first and second electrode units 122a and 122b and a nano-structure semiconductor light emitting device 110 mounted on the package substrate 121.

A permanent substrate 115 of the nano-structure semiconductor light emitting device 110 is connected to the first electrode unit 122a of the package substrate 121, and an electrode pad of the nano-structure semiconductor light emitting device 110 may be connected to the second electrode unit 122b of the package substrate 121 through a wire W.

In the package 100 according to the present exemplary embodiment, a contact electrode 96 is formed as a highly reflective electrode, significantly enhancing light extraction efficiency of the nano-structure semiconductor light emitting device 110

Figure 17:
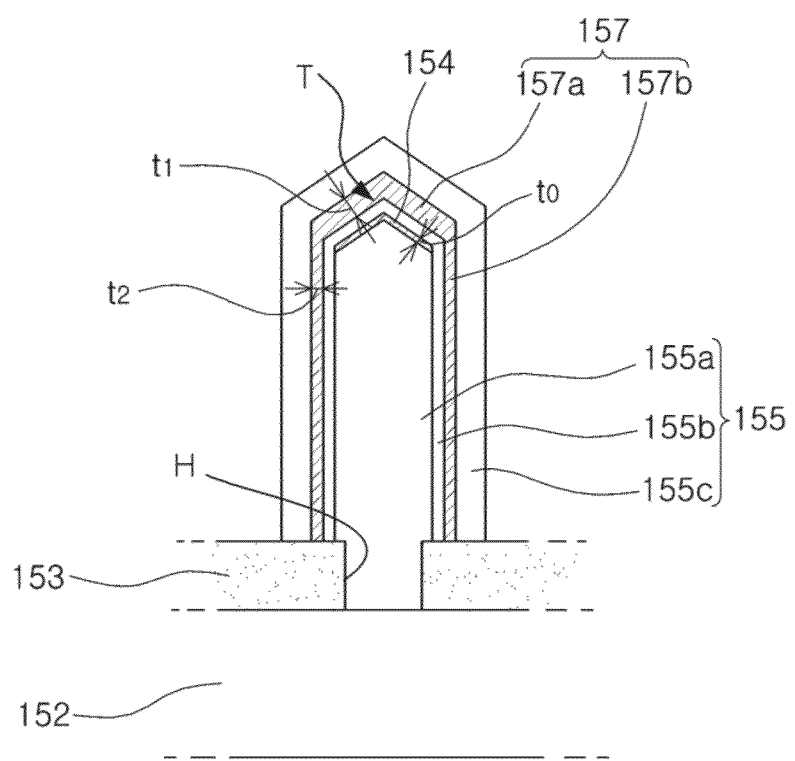
FIG. 17 is a cross-sectional view illustrating a nano-structure semiconductor light emitting device according to another exemplary embodiment of the present disclosure.

FIG. 17 is a cross-sectional view illustrating a nano-structure semiconductor light emitting device according to another exemplary embodiment of the present disclosure. In the exemplary embodiment, an n-side current blocking intermediate layer and a p-side current blocking intermediate layer as described above are combined.

A nano-structure semiconductor light emitting device 150 illustrated in FIG. 17 includes a base layer 152 formed of a first conductivity-type semiconductor material and a plurality of nano-light emitting structures 155 formed on the base layer 152.

Each nano-light emitting structure 155 includes a nanocore 155a formed of a first conductivity-type semiconductor, as well as an active layer 155b and a second conductivity-type semiconductor layer 155c sequentially formed on a surface of the nanocore 155a.

In the present exemplary embodiment, the descriptions related to FIG. 12 may be combined with detailed descriptions of an electrode structure according to the present exemplary embodiment, and descriptions of respective elements corresponding to those illustrated in FIG. 1 may be combined with the descriptions of the present exemplary embodiment.

As illustrated in FIG. 17, the nanocore 155a may include a tip portion T having a crystal face different from those of other regions.

The nano-structure semiconductor light emitting device 150 according to the present exemplary embodiment includes a first current blocking intermediate layer 154 formed in an n side and a second current blocking intermediate layer 157 formed in a p side based on the active layer 155b as a reference. The first current blocking intermediate layer 154 may be formed on a tip portion T of the nanocore 155a so as to be positioned between the active layer 155b and the nanocore 155a. Also, the second current blocking intermediate layer 157 may be formed in a region corresponding to the tip portion T of the nanocore 155a so as to be positioned between the active layer 155b and the second conductivity-type semiconductor layer 155c.

The first current blocking intermediate layer 154 may be undoped semiconductor or semiconductor doped with a second conductivity-type impurity, and the second current blocking intermediate layer 157 may be an undoped semiconductor layer or a semiconductor layer doped with a first conductivity-type impurity.

A thickness t0 of the first current blocking intermediate layer 154 may be approximately 20 nm or greater, preferably, 50 nm or greater, in order to obtain sufficient electrical resistance. The second conductivity-type impurity of the first current blocking intermediate layer 154 may obtain desired high resistance with approximately $1.0 \times 10^{16}/cm^3$ or greater.

Unlike the first current blocking intermediate layer, the second current blocking intermediate layer 157 may be formed on the entire surface of the nano-structure such that portions thereof positioned on the lateral surface and on the tip portion T may have different thicknesses. Namely, in the second current blocking intermediate layer 157, a thickness t2 of the portion 157b positioned in the region corresponding to the lateral surface of the nanocore 155a may be smaller than a thickness t1 of the portion 157a positioned in the region corresponding to the tip portion T of the nanocore 155a.

In the present exemplary embodiment, since the second current blocking intermediate layer 157 has the sufficient thickness t1 in the tip portion T of the nanocore 155a, a leakage current may be effectively prevented, and since the second current blocking intermediate layer 157 has a relatively small thickness t2 on the lateral surface of the nanocore 155a, desired electrical conduction for driving the light emitting device may be guaranteed.

In order to effectively guarantee the selective blocking and electrical conduction, preferably, the second current blocking intermediate layer 157 is formed to have appropriate thickness variations. In the second current blocking intermediate layer 157, the thickness t1 of the portion 157a corresponding to the tip portion T of the nanocore 155a is approximately 50 nm or greater, and the thickness t2 of the portion 157b positioned in the region corresponding to the lateral surface of the nanocore 155a may be approximately 20 nm or smaller.

Also, the second current blocking intermediate layer 157 may extend to be contiguous with a surface of the insulating layer 153. The portion 157b positioned in the region corresponding to the lateral surface of the nanocore 155a may extend to the insulating layer 153 to effectively block a leakage current generated in a space between the insulating layer 153 and the semiconductor layer (in particular, the active layer 155b). In order to obtain such a leakage current suppression effect, the thickness t2 of the portion 157b positioned in the region corresponding to the lateral surface of the nanocore 155*a* may be approximately 5 nm or greater.

Hereinafter, conditions of a current blocking intermediate layer together with effects of the present disclosure will be described in detail through specific exemplary embodiments.

Embodiment 1

A mask having a dual-layer structure including $SiN_x$(120 nm)/$SiO_2$ (1900 nm) was formed on an n-type GaN layer as a base layer. A plurality of openings each having a diameter of approximately 300 nm were formed in the mask through an etching process. Nanocores, n-type GaN, were grown to have a height of approximately 1800 nm by using the mask as a mold.

Subsequently, with the mask retained as is, a p-type GaN layer in which a magnesium (Mg) impurity was doped with concentration of approximately $5\times10^{17}/cm^3$ was formed to have a thickness of approximately 100 nm on upper surfaces of the nanocores. Thereafter, the $SiO_2$ layer, an upper layer, of the mask was removed, and the nanocores were heat-treated at a temperature of approximately 1100. Subsequently, an active layer including a plurality of $In_{0.2}Ga_{0.8}N$ well layers and a plurality of GaN barrier layers, a p-type AlGaN EBL layer, and p-type GaN were sequentially formed on surfaces of the nanocores, as shell layers, to form nano-light emitting structures.

An ITO layer was deposited on surfaces of the nano-light emitting structures obtained thusly, spaces between the nano-light emitting structures were filled, such that the nano-light emitting structures were covered by using spin-on-glass (SOG), and electrode structures were formed, thus manufacturing a nano-structure semiconductor light emitting device.

With the nano-structure semiconductor light emitting device obtained in Embodiment 1, a current blocking effect by the current blocking intermediate layer was checked, while gradually increasing an applied current from 30 mA to 120 mA. The results are illustrated as a graph of FIG. 18A.

Figure 18A:
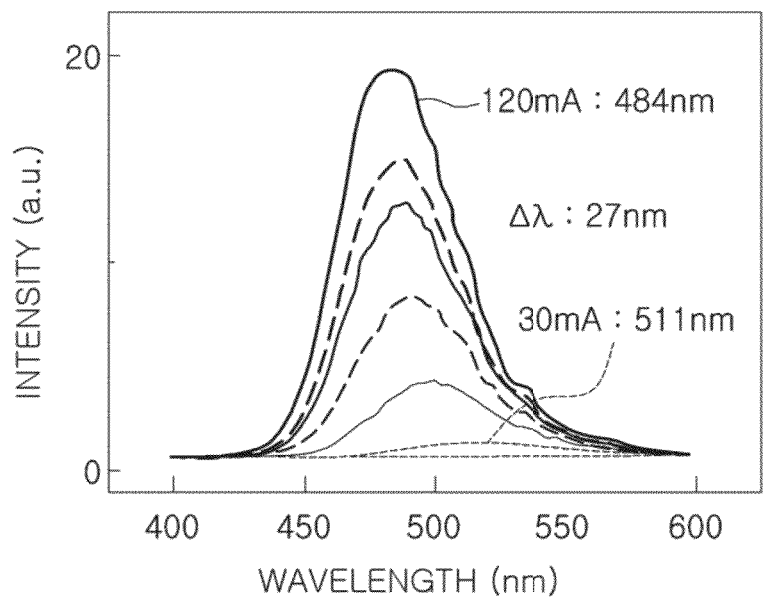
FIGS. 18A through 18C are views illustrating wavelength spectrums according to current application to the nano-structure semiconductor light emitting device obtained in Embodiment 1 to Embodiment 3.

As illustrated in FIG. 18A, experiment results of this embodiment showed that a width of variations of wavelength was 27 nm. It can be seen that such a width of variations of wavelength is significantly smaller than a width (approximately 39 nm) of variations of wavelength in the case in which a current blocking intermediate layer was not provided.

Since the active layer positioned in the surface (r face) of the tip portion of each nanocore has a large width of variations of wavelength according to an applied current, relative to the active layer in other regions, such a reduction (smaller width) indicates that the current blocking intermediate layer positioned on the surface (r face) of the tip portion of the nanocore according to this embodiment effectively blocks a current in the corresponding region.

Embodiment 2

Similar to Embodiment 1, a mask having a dual-layer structure including $SiN_x$ (120 nm)/$SiO_2$ (1900 nm) was formed on an n-type GaN layer as a base layer. A plurality of openings each having a diameter of approximately 300 nm were formed in the mask through an etching process. Nanocores, n-type GaN, were grown to have a height of approximately 1800 nm by using the mask as a mold.

However, in this embodiment, unlike Embodiment 1, a current blocking intermediate layer was formed after formation of an active layer. Namely, the $SiO_2$ layer, an upper layer, of the mask was first removed, nanocores were heat-treated at a temperature of approximately 1100° C., an active layer including a plurality of $In_{0.2}Ga_{0.8}N$ well layers and a plurality of GaN barrier layers were formed, and a current blocking intermediate layer, an n-type GaN layer, in which silicon (Si) impurity was doped with concentration of approximately $5\times10^{17}/cm^3$ was formed on the active layer. The current blocking intermediate layer formed on a lateral surface was formed to be contiguous with the residual $SiN_x$ layer. Here, growth conditions of the current blocking intermediate layer in a vertical direction were strengthened to set a thickness of the current blocking intermediate layer in the tip portion greater than that of the current blocking intermediate layer in the lateral surface (a thickness of the current blocking intermediate layer in the tip portion was approximately 80 nm and a thickness thereof in the lateral surface was approximately 15 nm).

Subsequently, a p-type AlGaN EBL layer and a p-type GaN layer were sequentially formed on the current blocking intermediate layer to form nano-light emitting structures. An ITO layer was deposited on surfaces of the nano-light emitting structures, and An ITO layer was deposited on surfaces of the nano-light emitting structures obtained thusly, spaces between the nano-light emitting structures were filled, such that the nano-light emitting structures were covered by using pin-on-glass (SOG), and electrode structures were formed, thus manufacturing a nano-structure semiconductor light emitting device.

With the nano-structure semiconductor light emitting device obtained in Embodiment 2, a current blocking effect by the current blocking intermediate layer was checked, while gradually increasing an applied current from 10 mA to 120 mA. The results are illustrated as a graph of FIG. 18B.

Figure 18B:
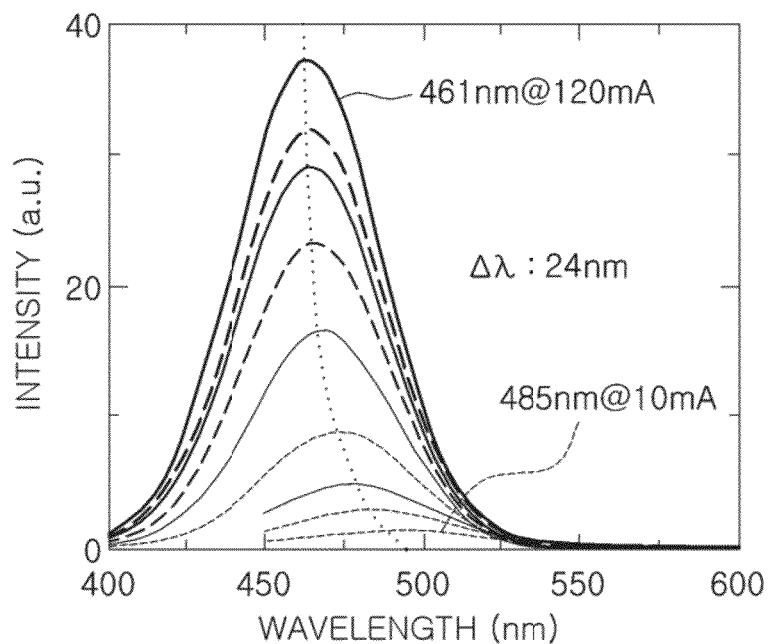

As illustrated in FIG. 18B, experiment results of this embodiment showed that a width of variations of wavelength was 24 nm. Namely, compared to the case (50 nm) without a current blocking intermediate layer, the width of variations of wavelength is significantly smaller.

This is because the current blocking intermediate layer formed in r face, i.e., the tip portion, according to this embodiment reduced influence of variations of wavelength according to an applied current by the r face. In this manner, it can be seen that the current blocking intermediate layer according to this embodiment effectively blocks a current in the tip portion of the nano-structure.

Figure 19:
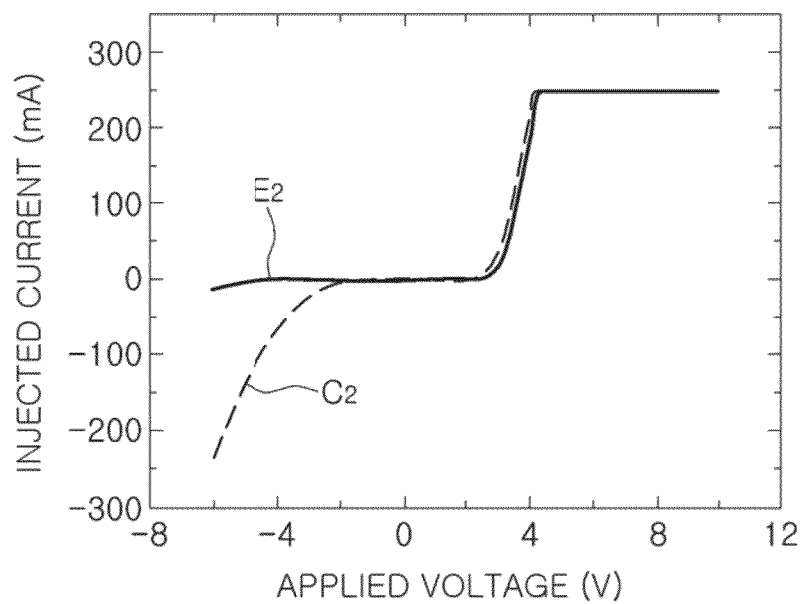
FIG. 19 is a graph illustrating an effect of improving a leakage current of the nano-structure semiconductor light emitting device obtained in Embodiment 2.

In addition, as illustrated in FIG. 19, in the related art structure C2, a leakage current was 150 mA at −4V, but it can be seen that when a current blocking intermediate layer according to this embodiment E2 was provided, a leakage current was significantly suppressed to 5 mA. This is because, as described above with reference to FIG. 12, the effect of the presence of the current blocking intermediate layer is increased as a leakage current generated in a semiconductor layer positioned on a surface of an insulating layer, as well as a leakage current generated in the tip portion of the nanocore, is suppressed.

Embodiment 3

In this exemplary embodiment, both the current blocking intermediate layers according to Embodiment 1 and Embodiment 2 were employed. Namely, the n-side current blocking intermediate layer (Mg-doped GaN or undoped GaN) was formed on an upper surface of the nanocores before the upper layer ($SiO_2$) of the mask was removed according to the process of Embodiment 1, and subsequently, the upper layer of the mask was removed, the active layer was formed on the surface of the nanocore, and the p-side current blocking intermediate layer (Si-doped GaN or undoped GaN) was formed according to the process of Embodiment 2.

Next, similar to the former exemplary embodiment, an electrode and passivation formation process was performed to manufacture a semiconductor light emitting device.

With the nano-structure semiconductor light emitting device obtained in Embodiment 3, a current blocking effect of the current blocking intermediate layer was checked, while gradually increasing an applied current from 10 mA to 120 mA. The results are illustrated as a graph of FIG. 18C.

Figure 18C:
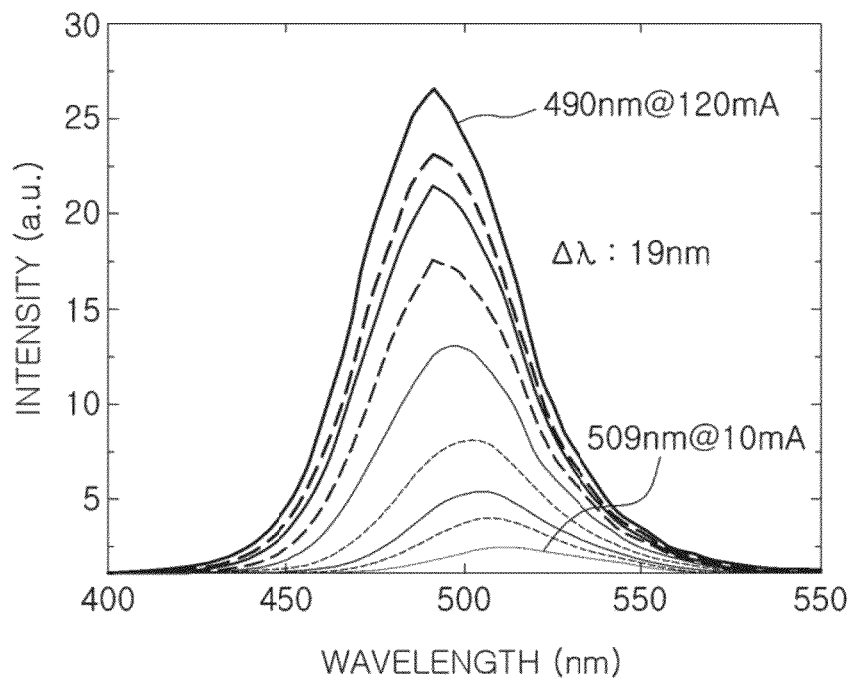

As illustrated in FIG. 18C, experiment results of this embodiment showed that a width of variations of wavelength was 19 nm. Namely, compared to the case (50 nm) without a current blocking intermediate layer, the width of variations of wavelength is significantly smaller.

Thus, it as confirmed that, by employing two types of current blocking intermediate layer, a current in the tip portion of the nano-structure was effectively blocked.

Figure 20:
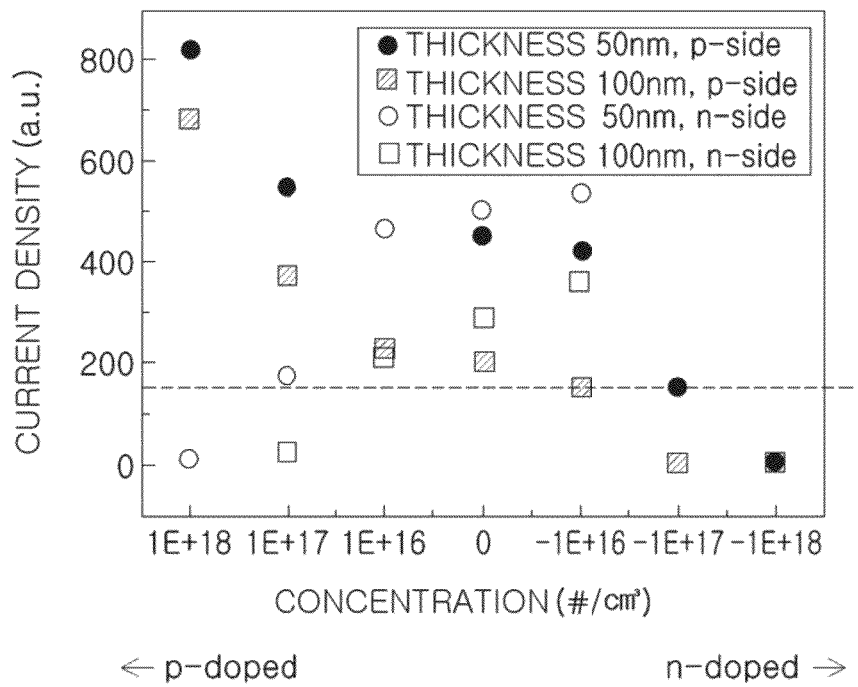
FIG. 20 is a graph illustrating a change in current density over doping concentration of a current blocking intermediate layer.
Figure 21:
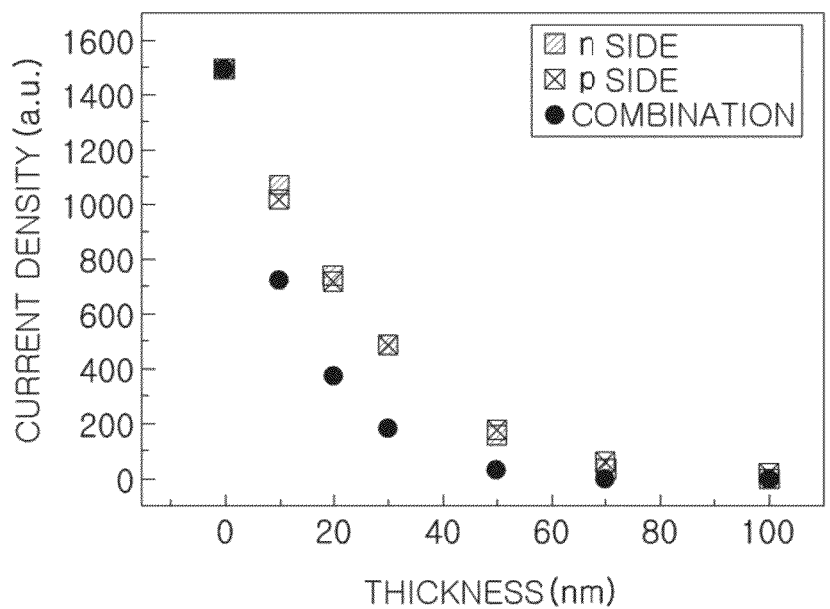
FIG. 21 is a graph illustrating a change in current density over thickness of the current blocking intermediate layer.

FIG. 20 is a graph illustrating a change in current density over doping concentration of a current blocking intermediate layer, and FIG. 21 is a graph illustrating a change in current density over thickness of the current blocking intermediate layer;

First, as illustrated in FIG. 20, in a configuration in which the n-side current blocking intermediate layer (between the active layer and the tip portion of the nanocore) and the p-side current blocking intermediate layer (between the active layer and the p-type semiconductor layer) were employed, when a thickness of the p-side current blocking intermediate layer was 50 nm, current density was approximately 160 a.u. when concentration of the opposite conductive impurity was approximately $1.0 \times 10^{17}/cm^3$. Namely, the current density was reduced to ⅒ times, in comparison to the case without the current blocking intermediate layer (current density ~1600 a.u.). In a case in which a thickness of the p-side current blocking intermediate layer was 100 nm, current density was approximately 160 a.u. at relatively low concentration of $1.0 \times 10^{16}/cm^3$, which was reduced to ⅒ times than that of the case (current density ~1600 a.u.) without the current blocking intermediate layer.

As illustrated in FIG. 21, it was confirmed that, in the case in which the n-side current blocking intermediate layer and the p-side current blocking intermediate layer were separately employed, current density was reduced to ⅒th when the both current blocking intermediate layers had a thickness of 50 nm or greater. In the configuration in which the two types of current blocking intermediate layer were employed, a desired effect was obtained even when the current blocking intermediate layers had a smaller thickness of 30 nm or more.

In order to confirm the leakage current improvement effect according to high doping concentration conditions, in the nano-structure semiconductor light emitting device according to Embodiment 1, leakage current incidence was checked by changing impurity concentration (p-type impurity) of the current blocking intermediate layer up to $1 \times 10^{19}/cm^3$. Doping concentration of silicon (Si), the n-type impurity of the nanocore used in this embodiment was at a $1\sim9 \times 10^{19}/cm^3$ level, and the leakage current incidence was defined by percentage of a leakage current when the current blocking intermediate layer was employed to a leakage current (current density: 1600 a.u.) when the current blocking intermediate layer was not employed, and the measurement results are shown in FIG. 22.

Figure 22:
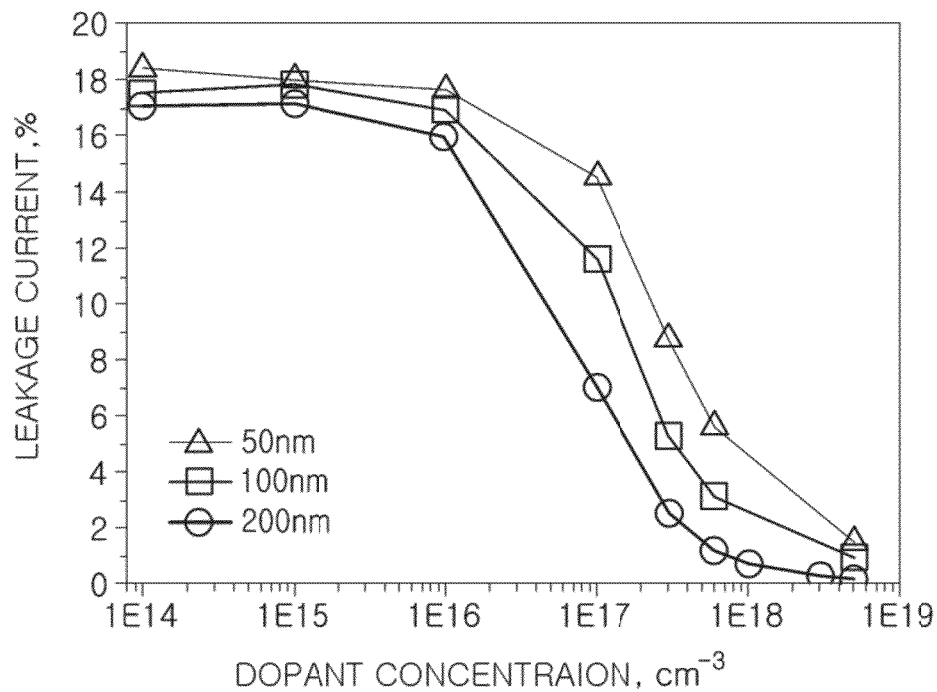
FIG. 22 is a graph illustrating a change in current density over a thickness and doping concentration of the current blocking intermediate layer.

Referring to FIG. 22, it was confirmed that leakage current improvement effects were slightly different according to thicknesses. It can be seen that, as the thickness was increased from 50 nm to 200 nm, the leakage current incidence was reduced. Namely, in case of an impurity concentration of $1 \times 10^{17}/cm^3$, the leakage current incidence was 15% when a thickness of the current blocking intermediate layer was 50 nm, and 12% when a thickness thereof was 100 nm, and 6.5% when a thickness thereof was 200 nm, indicating that a leakage current was significantly suppressed. Also, when impurity concentration was $1 \times 10^{18}/cm^3$ or more, the leakage current incidence was 5% or less, and when the impurity concentration was $1 \times 10^{19}/cm^3$ or more, the leakage current incidence was 1% or less regardless of a thickness of the current blocking intermediate layer, indicating that the leakage current was completely suppressed.

The nano-semiconductor light emitting device according to the exemplary embodiment as described above may be implemented to various packages other than the package illustrated in FIG. 16.

Figure 23:
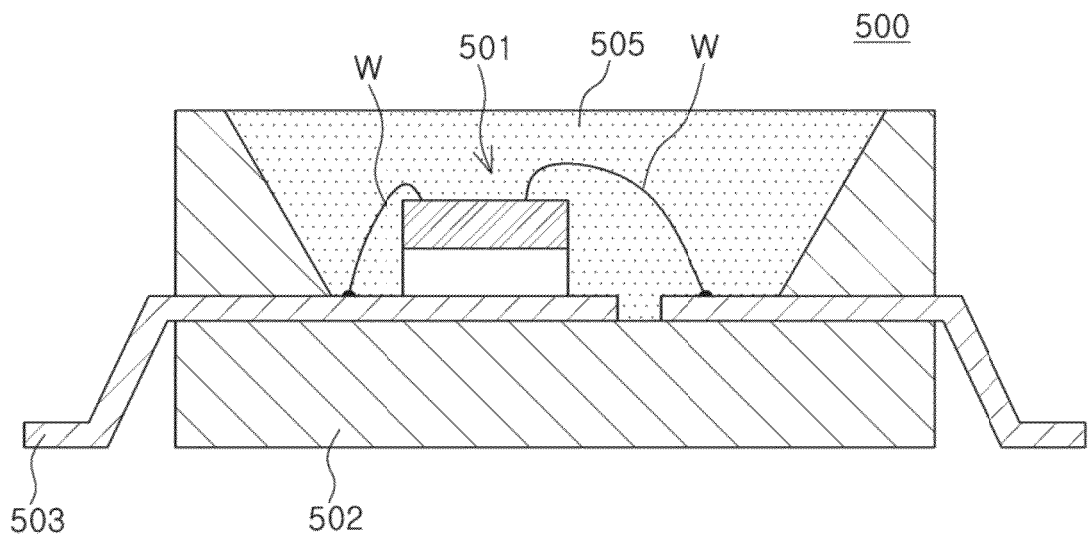
FIGS. 23 and 24 are views illustrating various examples of a semiconductor light emitting device package employing a semiconductor light emitting device according to an exemplary embodiment of the present disclosure.
Figure 24:
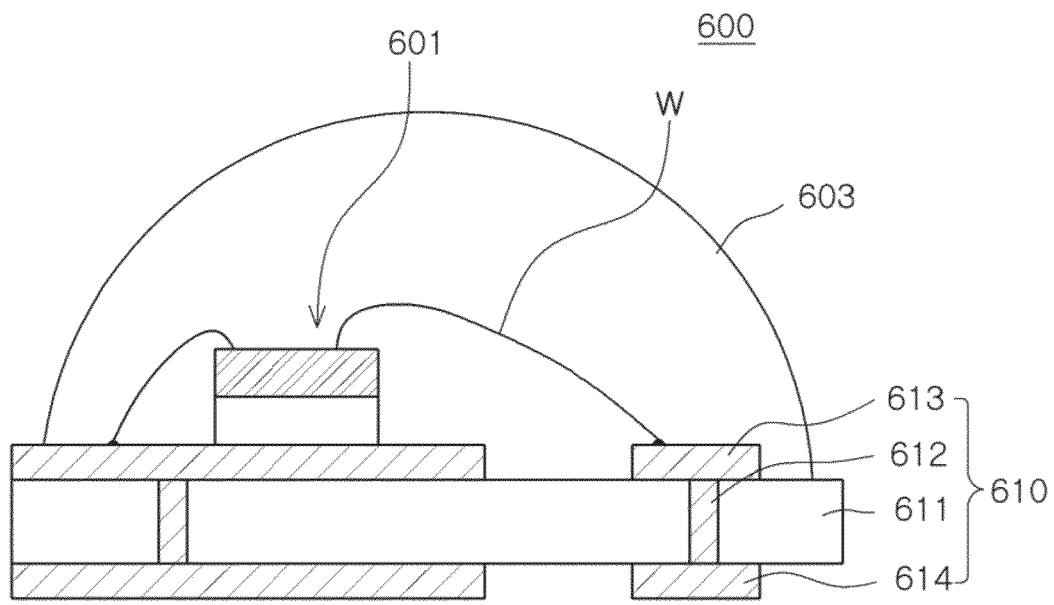

FIGS. 23 and 24 are views illustrating examples of a package employing the foregoing semiconductor light emitting device.

A semiconductor light emitting device package 500 may include a semiconductor light emitting device 501, a package body 502, and a pair of lead frames 503.

The semiconductor light emitting device 501 may be the nano-semiconductor light emitting device. The semiconductor light emitting device 501 may be mounted on the lead frame 503 and electrically connected to the lead frame through a wire W.

If necessary, the semiconductor light emitting device 501 may be mounted on a different region, for example, on the package body 502, rather than on the lead frame 503. Also, the package body 502 may have a cup shape to improve reflectivity efficiency of light. An encapsulator 505 formed of a light-transmissive material may be formed in the reflective cup to encapsulate the semiconductor light emitting device 501, the wire W, and the like.

A semiconductor light emitting device package 600 illustrated in FIG. 24 may include a semiconductor light emitting device 601, a mounting board 610, and an encapsulator 603.

A wavelength conversion unit 602 may be formed on a surface and a lateral surface of the semiconductor light emitting device 601. The semiconductor light emitting device 601 may be mounted on the mounting board 610 and electrically connected to the mounting board 610 through a wire W.

The mounting board 610 may include an upper electrode 61, a lower electrode 614, and a through electrode 612 connecting the upper electrode 613 and the lower electrode 614. The mounting board 610 may be provided as a board such as PCB, MCPCB, MPCB, FPCB, or the like, and the structure of the mounting board 610 may be applied to have various forms.

The wavelength conversion unit 602 may include a phosphor, a quantum dot, or the like. The encapsulator 603 may be formed to have a lens structure with an upper surface having a convex dome shape. However, according to an exemplary embodiment, the encapsulator 603 may have a lens structure having a convex or concave surface to adjust a beam angle of light emitted through an upper surface of the encapsulator 603.

The nano-structure semiconductor light emitting device and a package having the same according to the exemplary embodiment as described above may be advantageously applied to various application products.

Figure 25:
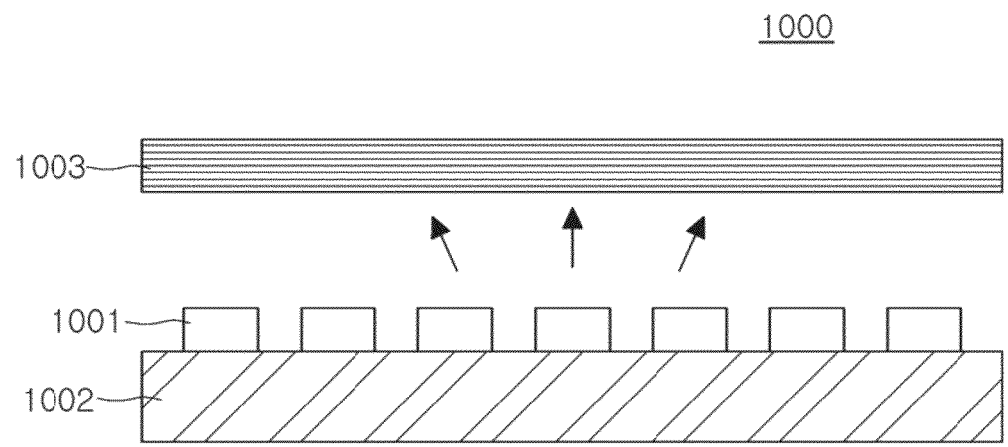
FIGS. 25 and 26 are views illustrating a backlight unit employing a semiconductor light emitting element according to an exemplary embodiment of the present disclosure.
Figure 26:
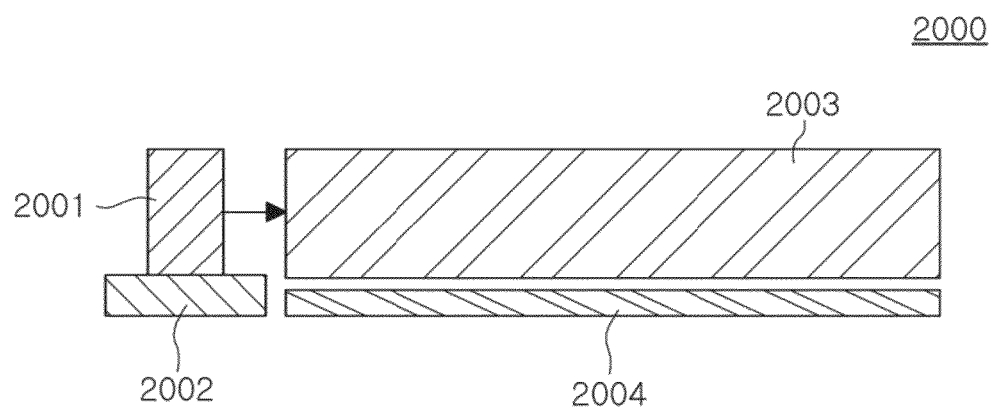

FIGS. 25 and 26 are views illustrating a backlight unit employing a semiconductor light emitting element according to an exemplary embodiment of the present disclosure.

Referring to FIG. 25, a backlight unit 1000 includes light sources 1001 mounted on a substrate 1002 and one or more optical sheets 1003 disposed above the light sources 1001. The aforementioned semiconductor light emitting device or a package employing the semiconductor light emitting device may be used as the light sources 1001.

Unlike the backlight unit 1000 in FIG. 25 in which the light sources 1001 emit light toward an upper side on which a liquid crystal display is disposed, a backlight unit 2000 as another example illustrated in FIG. 26 is configured such that light sources 2001 mounted on a substrate 2002 emit light in a lateral direction, and the emitted light may be made to be incident to a light guide plate 2003 so as to be converted into a surface light source. Light, passing through the light guide plate 2003, is emitted upwards, and in order to enhance light extraction efficiency, a reflective layer 2004 may be disposed on a lower surface of the light guide plate 2003.

FIG. 26 is a view illustrating an example of a lighting device employing a semiconductor light emitting device package thereof according to an exemplary embodiment of the present disclosure.

A lighting device 3000 is illustrated, for example, as a bulb-type lamp in FIG. 26, and includes a light emitting module 3003, a driving unit 3008, and an external connection unit 3010.

Also, the lighting device 3000 may further include external structures such as external and internal housings 3006 and 3009 and a cover unit 3007. The light emitting module 3003 may include a light source 3001 having the aforementioned semiconductor light emitting device package structure or a structure similar thereto and a circuit board 3002 with the light source 3001 mounted thereon. For example, the first and second electrodes of the aforementioned semiconductor light emitting device may be electrically connected to an electrode pattern of the circuit board 3002. In the present exemplary embodiment, it is illustrated that a single light source 3001 is mounted on the circuit board 3002, but a plurality of light sources may be mounted as needed.

The external housing 3006 may serve as a heat dissipation unit and may include a heat dissipation plate 3004 disposed to be in direct contact with the light emitting module 3003 to enhance heat dissipation and heat dissipation fins 3005 surrounding the lateral surfaces of the lighting device 3000. Also, the cover unit 3007 may be installed on the light emitting module 3003 and have a convex lens shape. The driving unit 3008 is installed in the internal housing 3009 and connected to the external connection unit 3010 having a socket structure to receive power from an external power source. Also, the driving unit 3008 may serve to convert power into an appropriate current source for driving the semiconductor light emitting device 3001 of the light emitting module 3003, and provide the same. For example, the driving unit 3008 may be configured as an AC-DC converter, a rectifying circuit component, or the like.

Figure 27:
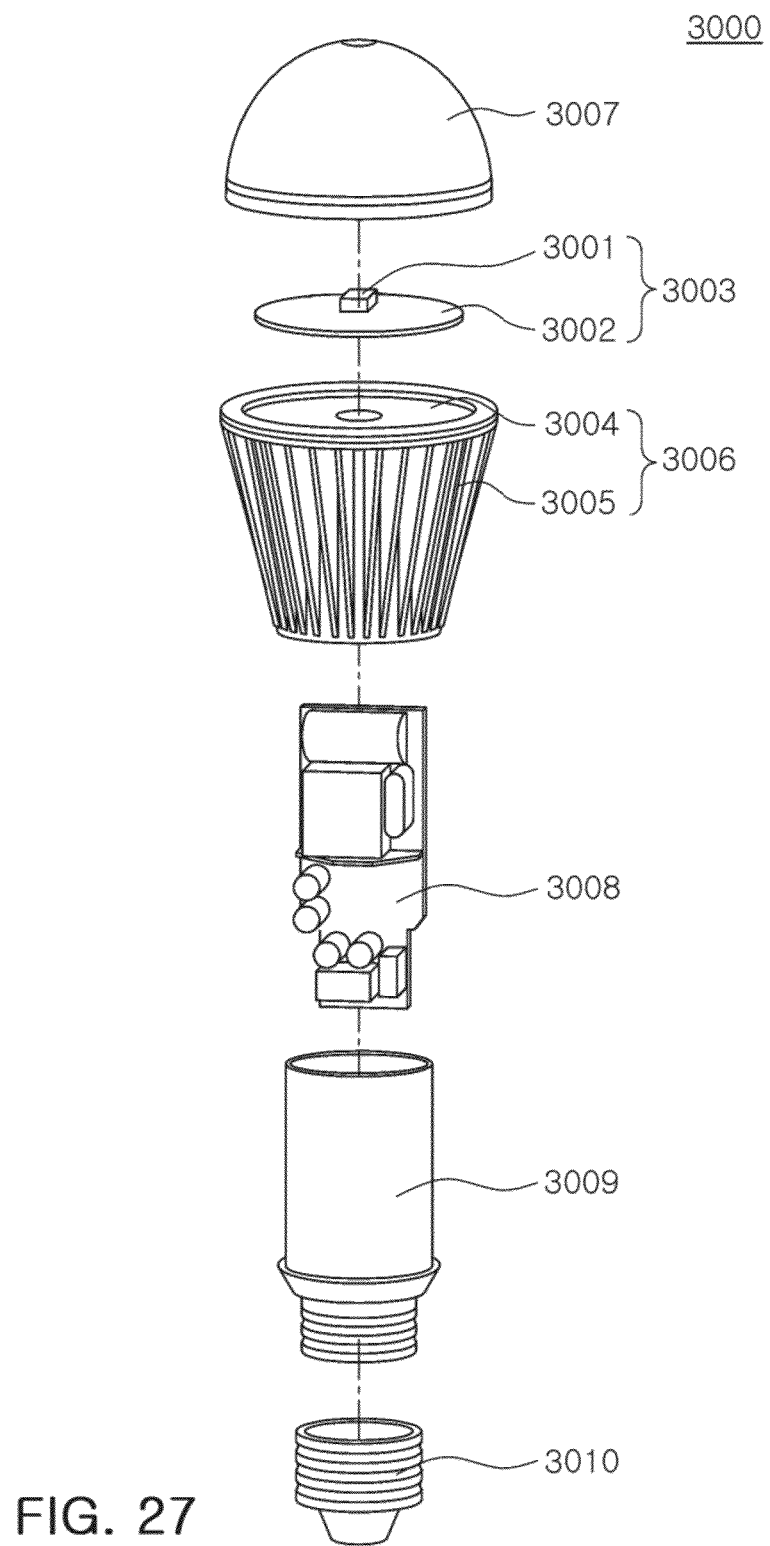
FIG. 27 is a view illustrating an example of a lighting device employing a semiconductor light emitting element according to an exemplary embodiment of the present disclosure.
Figure 28:
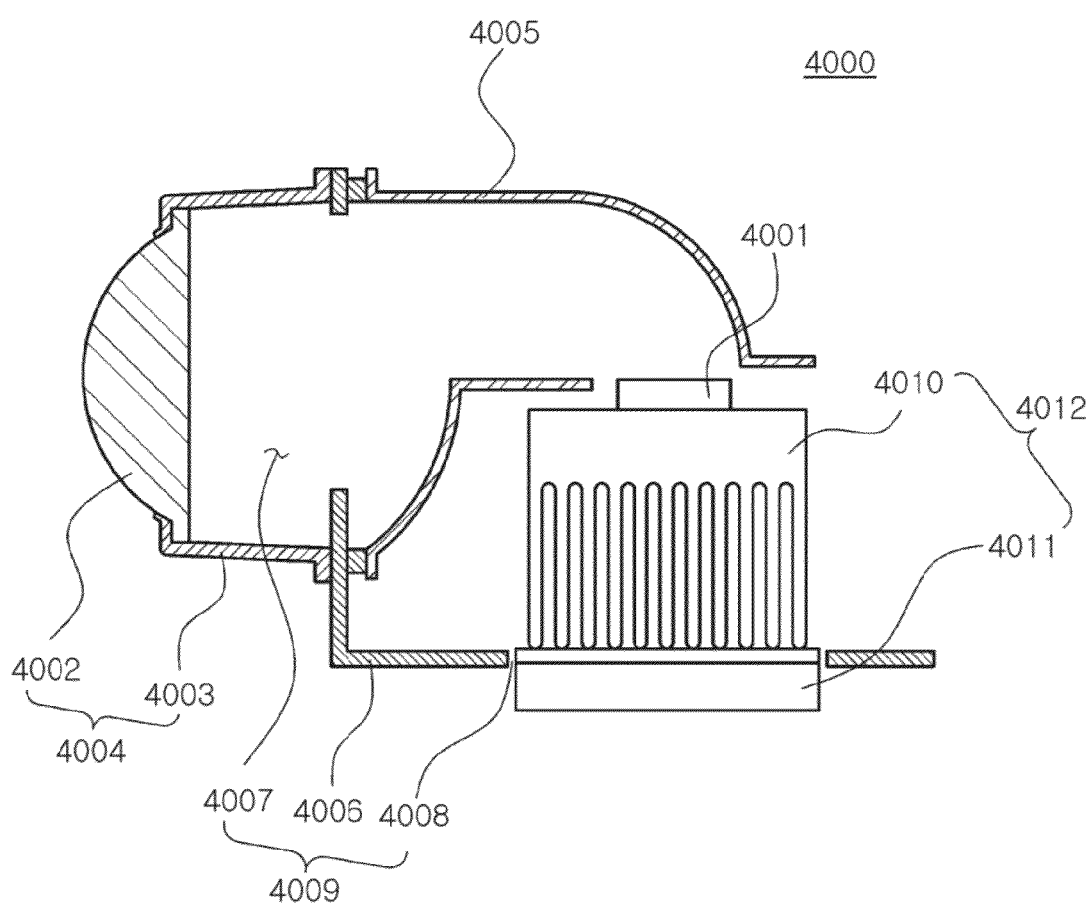
FIG. 28 is a view illustrating an example of a headlamp employing a semiconductor light emitting element according to an exemplary embodiment of the present disclosure.

FIG. 27 is a view illustrating an example of a lighting device employing a semiconductor light emitting element according to an exemplary embodiment of the present disclosure.

Referring to FIG. 27, a headlamp 4000 used as a vehicle lamp, or the like, may include a light source 4001, a reflective unit 4005, and a lens cover unit 4004. The lens cover unit 4004 may include a hollow guide 4003 and a lens 4002. The light source 4001 may include the aforementioned semiconductor light emitting device or a package including the semiconductor light emitting device.

The headlamp 4000 may further include a heat dissipation unit 4012 outwardly dissipating heat generated by the light source 4001. In order to effectively dissipate heat, the heat dissipation unit 4012 may include a heat sink 4010 and a cooling fan 4011. Also, the headlamp 4000 may further include a housing 4009 fixedly supporting the heat dissipation unit 4012 and the reflective unit 4005, and the housing 4009 may have a central hole 4008 formed in one surface thereof, in which the heat dissipation unit 4012 is coupled.

Also, the housing 4009 may have a front hole 4007 formed in the other surface integrally connected to the one surface and bent in a right angle direction. The front hole 4007 may allow the reflective unit 4005 to be fixedly positioned above the light source 4001. Accordingly, a front side is opened by the reflective unit 4005, and the reflective unit 4005 is fixed to the housing 4009 such that the opened front side corresponds to the front hole 4007, and light reflected by the reflective unit 4005 may pass through the front hole 4007 to be output outwardly.

As set forth above, according to exemplary embodiments of the present disclosure, a leakage current generated due to nano-light emitting structures may be alleviated. In particular, a leakage current in a region positioned in a tip portion of a nano-light emitting structure may be effectively blocked, providing a highly efficient semiconductor light emitting device. In a specific embodiment, a leakage current generated between an insulating layer and a semiconductor layer may also be improved. Also, since only an active layer region formed on a single crystal face in a nano-light emitting structure may take part in emitting light, promoting uniform optical properties.

The foregoing technical solutions and effects are not limited to those described above. The foregoing and other objects, features, aspects and advantages of the present disclosure will become more apparent from the above detailed description of the present disclosure when taken in conjunction with the accompanying drawings.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a light emitting device having a plurality of nano-light emitting structures, comprising:
   depositing a first conductivity-type semiconductor material on a substrate to form a base layer;
   forming a mask having a plurality of openings on the base layer;
   depositing the first conductivity-type nitride semiconductor material in the openings of the mask to form a plurality of nanocores having a main portion bounded by the mask and an exposed tip portion;
   depositing a current blocking layer on the tip portion of the nanocores;
   removing a portion of the mask to expose the main portion of the nanocore;
   depositing an active material layer on the plurality of nanocores; and
   depositing a second conductivity-type nitride semiconductor layer on the active material layer.

2. The method according to claim 1, further comprising depositing a contact electrode material on the second conductivity-type nitride semiconductor layers of the plurality of nano-light emitting structures to form a contact electrode.

3. The method according to claim 2, further comprising forming a first electrode contacting the base layer; and
   forming a second electrode contacting the contact electrode.

4. The method according to claim 3, further comprising depositing an insulating layer on the contact electrode.

5. The method according to claim 1, further comprising depositing a second current blocking layer between the active material layer and the second conductivity-type nitride semiconductor layer.

6. The method according to claim 1, wherein the depositing the current blocking layer comprises depositing an undoped nitride or a nitride doped with a conductivity-type impurity opposite to that of the nanocore conductivity-type material.

7. The method according to claim 1, wherein the forming the mask comprises forming a first mask layer and a second mask layer.

8. The method according to claim 7, wherein the removing a portion of the mask comprises removing the second mask layer.

9. A method of manufacturing a light emitting device having a plurality of nano-light emitting structures, comprising:
    depositing a first conductivity-type semiconductor material on a substrate to form a base layer;
    forming a mask having a plurality of openings on the base layer;
    depositing the first conductivity-type nitride semiconductor material in the openings of the mask to form a plurality of nanocores having a main portion and a tip portion;
    removing a portion of the mask to expose the main portion of the nanocore;
    depositing an active material layer on the plurality of nanocores;
    depositing a current blocking layer on the active material layer; and
    depositing a second conductivity-type nitride semiconductor layer on the current blocking layer.

10. The method according to claim 9, further comprising depositing a contact electrode material on the second conductivity-type nitride semiconductor layers of the plurality of nano-light emitting structures to form a contact electrode.

11. The method according to claim 10, further comprising forming a first electrode contacting the base layer; and
    forming a second electrode contacting the contact electrode.

12. The method according to claim 11, further comprising depositing an insulating layer on the contact electrode material.

13. The method according to claim 9, wherein the depositing the current blocking layer comprises depositing an undoped nitride or a nitride doped with a conductivity-type impurity opposite to that of the nanocore on the active material layer.

14. The method according to claim 9, wherein the forming the mask comprises forming a first mask layer and a second mask layer.

15. The method according to claim 14, wherein the removing a portion of the mask comprises removing the second mask layer.

16. A method of manufacturing a light emitting device having a plurality of nano-light emitting structures, comprising:
    depositing a first conductivity-type semiconductor material on a substrate to form a base layer;
    depositing a first mask material on the base layer to form a first mask layer;
    depositing a second mask material on the first mask layer to form a second mask layer, wherein the second mask layer has a different etching rate than the first mask layer;
    forming a plurality of openings in the first mask layer and second mask layer exposing the base layer;
    depositing first conductivity-type nitride semiconductor material in the openings of the mask to form a plurality of nanocores having a main portion bounded by the first and second masking layers and an exposed tip portion;
    heat treating the nanocores at a temperature of 600° C. to 1200° C.;
    depositing a current blocking layer overlying the plurality of nanocores;
    removing the second masking layer to expose the main portion of the nanocore;
    depositing an active material layer overlying the plurality of nanocores; and
    depositing a second conductivity-type nitride semiconductor layer overlying the active material layer.

17. The method according to claim 16, further comprising depositing a contact electrode material on the second conductivity-type nitride semiconductor layers of the plurality of nano-light emitting structures to form a contact electrode.

18. The method according to claim 17, further comprising forming a first electrode contacting the base layer; and
    forming a second electrode contacting the contact electrode.

19. The method according to claim 16, wherein the blocking layer is formed between the plurality of nanocores and the active layer.

20. The method according to claim 16, wherein the blocking layer is formed between the active layer and the second conductivity-type nitride semiconductor layer.

* * * * *